United States Patent [19]
Kimura et al.

[11] Patent Number: 5,289,516
[45] Date of Patent: Feb. 22, 1994

[54] COUNTER DEVICE AND METHOD OF OPERATING THE SAME

[75] Inventors: Masatoshi Kimura; Minobu Yazawa, both of Hyogo, Japan

[73] Assignee: Mitsubishi Denki Kabushiki Kaisha, Tokyo, Japan

[21] Appl. No.: 700,024

[22] Filed: May 14, 1991

[30] Foreign Application Priority Data

Jun. 1, 1990 [JP] Japan ................... 2-145204

[51] Int. Cl.⁵ ............................................. G04B 19/24
[52] U.S. Cl. ......................................... 377/39; 377/33; 377/41; 377/107
[58] Field of Search ............... 377/39, 33, 41, 107

[56] References Cited

U.S. PATENT DOCUMENTS

| | | | |
|---|---|---|---|
| 4,193,255 | 3/1980 | Ebihara et al. | 377/39 |
| 4,566,111 | 1/1986 | Tanagawa | 377/39 |
| 5,164,969 | 11/1992 | Alley et al. | 377/39 |

*Primary Examiner*—William L. Sikes
*Assistant Examiner*—Scott A. Ouellette
*Attorney, Agent, or Firm*—Lowe, Price, LeBlanc & Becker

[57] ABSTRACT

A counter device having a jumping function includes a counter circuit for counting clock pulses, a circuit for setting a jump starting count, a circuit for setting the number of bits to be jumped, a detecting circuit for detecting equality/unequality between a count of the counter circuit and the jump starting count as set, and a circuit for modifying the count of the counter circuit by the number of bits to be jumped in response to equality detection by the detecting circuit. The modifying circuit varies the count in the same direction as a direction of variation of the count provided by the counter circuit. This construction realizes a counting function which jumps a desired count or counts from a selected count.

18 Claims, 15 Drawing Sheets

FIG. 16A

"H" ONLY AT NODE ① → COUNT UP BY 1

"H" ONLY AT NODE ② → COUNT UP BY 2

EX.)      ② LSB
    1 1 (0) 1          1 1 0 1
    ↓ ↓ ↓ ↓    ⇒      1 1 1 0  } 2 COUNTS
    1 1 1 1            1 1 1 1

FIG. 16C

"H" ONLY AT NODE ③ → COUNT UP BY 4

EX.)    ③   LSB
    0 1 (1) 0 1          0 1 1 0 1
    ↓ ↓ ↓ ↓ ↓    ⇒      0 1 1 1 0
    1 0 0 0 1            0 1 1 1 1  } 4 COUNTS
                         1 0 0 0 0
                         1 0 0 0 1

FIG. 16D

"H" ONLY AT NODE ④ → COUNT UP BY 8
        (NOT SHOWN)

EX.)    ④     LSB
    1 0 1 1 0 1          1 0 1 1 0 1
    ↓ ↓ ↓ ↓ ↓ ↓    ⇒    1 0 1 1 1 0
    1 1 0 1 0 1          1 0 1 1 1 1
                         1 1 0 0 0 0
                         1 1 0 0 0 1  } 8 COUNTS
                         1 1 0 0 1 0
                         1 1 0 0 1 1
                         1 1 0 1 0 0
                         1 1 0 1 0 1

| SI(2) | SI(1) | SI(0) | THE NUMBER OF BITS TO BE JUMPED (DECIMAL) |
|---|---|---|---|
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

COUNTER DEVICE AND METHOD OF OPERATING THE SAME

BACKGROUND OF THE INVENTION

1. Field of the Invention

This invention relates to a counter device for counting clock pulses and to a method of driving the counter device. More particularly, the invention relates to an asynchronous binary counter and a method of operating the same, and a memory device with the counter embedded therein and operating method thereof

2. Description of the Background Art

Counter devices are used in various fields. Certain types of counter devices are used as timers, with a count thereof corresponding to a period of time, to generate a control signal for actuating or stopping a particular component at every predetermined counts.

In a certain system, a plurality of components are affixed with numbers, and a counter device is used for successively actuating the components according to the numbering. In this construction, a component of a number corresponding to a count of the counter device is actuated.

In a serially accessible memory device, word lines (rows) or bit lines (columns) are successively selected. A counter device called a program counter (or an address counter) is used to generate an address for designating a word line or a bit line to be selected. In this construction, the counter device successively increments or decrements its count in response to a control signal, and the count is used as an address for designating a word line or a bit line.

FIG. 1 is a view showing one example of conventional asynchronous binary counters, which is exemplified in "Principle of CMOS VLSI Design - A Systems Perspective" by Neil Weste et al, FIG. 8.25 on pages 335-336, published 1985, by Addison-Wesley Publishing Company.

Referring to FIG. 1, a conventional asynchronous binary counter 7 is a one-bit counter including a first-stage latch block 71 and a second-stage latch block 72. The first-stage latch block 71 includes transmission gates 6a and 6b which turn on and off in response to two phase non-overlapping, or complementary clock signals $\phi$, $\bar{\phi}$ applied through inputs C, $\bar{C}$, and inverters 8a and 8b for inverting signals applied thereto. In response to the clock signals $\phi$, $\bar{\phi}$, the transmission gate 6a passes an output Q generated from the second-stage latch block 72. The transmission gate 6b, in response to the clock signals $\phi$, $\bar{\phi}$, connects an input of the inverter 8a and an output of the inverter 8b. The inverter 8a inverts a signal received from the transmission gate 6a. The inverter 8b inverts a signal received from the inverter 8a.

Generally, a transmission gate has a construction in which the sources and the drains of an n-channel MOS (insulated gate field effect) transistor and a p-type MOS transistor are interconnected. The clock signals applied to control terminals of the transmission gates 6a and 6b have different phases, so that the transmission gates 6a and 6b turn on and off in a complementary manner.

Similarly, the second-stage latch block 72 includes transmission gates 6c and 6d, and two inverters 8a and 8b connected in series. The inverter 8c outputs the signal Q, and the inverter 8d outputs a signal $\bar{Q}$. The transmission gate 6c operates synchronously with the transmission gate 6b, while the transmission gate 6d with the transmission gate 6a.

The latch block 71 is in a through state when the clock signal $\phi$ is "H", a latching state when the clock signal $\phi$ is "L". The latch block 72 is in a through state when the clock signal $\phi$ is "L", and in a latching state when the clock signal $\phi$ is "H". The latching state is a state for continuously outputting an immediately preceding input signal regardless of a current input signal, whereas the through state is a state for just passing an input signal therethrough as an output.

The binary counter shown in FIG. 1 is a one-bit counter, and in practical use, normally, a plurality of such one-bit binary counters 7 are connected in series as shown in FIG. 2. FIG. 2 shows a construction for implementing an n+1-bit binary counter with n+1 one-bit binary counters 7a–7n connected in series.

In the asynchronous counter shown in FIG. 2, input signals (count inputs, i.e. clock signals $\phi$, $\bar{\phi}$) are applied only to the counter of the least significant bit. Each of the remaining counters receives outputs Q, $\bar{Q}$ of a counter of the lower bit at count inputs C, $\bar{C}$. More particularly, referring to FIG. 1, a higher bit counter receives outputs Q, $\bar{Q}$ of a lower bit counter instead of the clock signals $\phi$, $\bar{\phi}$. In such a counter, each counter excluding a first stage receives an output of a preceding counter stage as a clock signal. Clock signals to be count are applied only to the first counter stage. Such a counter is called an asynchronous counter or a ripple counter. An operation will be described next with reference to FIG. 3. FIG. 3 is a diagram showing operational waveforms of 3-bit binary counters 7a–7c (FIG. 2), i.e. three of the counter in FIG. 1 connected in a 3stage series.

It is assumed that, in an initial state prior to application of the clock signals $\phi$, $\bar{\phi}$, counter outputs Q0, Q1 and Q2 are all maintained in "L" level (logical "038 ").

The counter 7a at the first stage operates as follows. When the clock signal $\bar{\phi}$ rises to "H" (logical "1"), the transmission gate 6a turns on to transmit an "L" signal (output Q) to the first-stage latch block 71. The transmission gates 6b and 6c remain in an off state When the clock signal $\bar{\phi}$ falls from "H" to "L", the transmission gate 6a turns off and the transmission gate 6b on, thereby establishing data "L" in the first-stage latch block 71 owing to its latching function. Simultaneously, the established data "L" is transmitted from the first-stage latch block 71 to the second-stage latch block 72 through the transmission gate 6c. As a result, output $\bar{Q}$0 of the first-stage counter 7 becomes "H", and output Q0 is "L".

When the clock signal $\bar{\phi}$ rises to "H" again, the transmission gate 6c in the second-stage latch block 72 turns off, and the transmission gate 6d turns on, thereby establishing data in the second-stage latch block 72, i.e. output data Q0 and $\bar{Q}$0. The established output data Q0 in "H" level is transmitted to the first-stage latch block 71, and through the transmission gate 6a in the ON state to the inverter 8a.

When the clock signal $\phi$ falls from "H" to "L" again, the transmission gate 6b in the ON state forms a latch circuit in the first-stage latch block 71, thereby establishing data "H" in the first-stage latch block 71. Simultaneously, this data "H" is transmitted through the transmission gate 6c in the ON state to the inverter 8c in the second-stage latch block 72. As a result, output Q0 becomes "L" and output $\bar{Q}$0 "H".

By repeating this operation, the state of output Q0 of the first counter 7a changes each time the clock signal φ falls from "H" to "L". Output Q0 falls from "H" to "L" at every second fall of the clock signal φ. Thus, a onebit counter having counts "0" and "1" is realized.

The counter 7b at the second stage receives outputs Q0, $\overline{Q0}$ of the first counter 7a at the count inputs C, $\overline{C}$.

Consequently, the second counter 7b is operable by using output Q0 as its clock signal instead of the clock signal φ used in the first counter 7a. Thus, the state of output Q1 of the second counter 7b changes each time the output Q0 of the first counter 7a falls from "H" to "L". That is, output Q1 falls from "H" to "L" at every second fall of output Q0 of the first counter 7a and, therefore, returns to an initial state at every four counts of the clock signal φ.

The counter 7c at the third stage receives outputs $\overline{Q1}$, Q1 of the second counter 7b as count inputs. Thus, the state of output Q2 of the third counter 7c changes each time the output Q1 of the second counter 7b falls from "H" to "L". The third counter 7c operates in a period twice that of the second counter 7b and, therefore, returns to an initial state at every eight counts of the clock signal φ.

Where, as described above, three counters 7a-7c are connected in series, a binary counter for counting up clock signals φ and providing counts in binary notation is realized by using output Q2 as the most significant bit and output Q0 as the least significant bit.

Similarly, a count-down binary counter is obtained by using outputs $\overline{Q}$ of respective counter stages.

The conventional binary counter is constructed as described above, which receives clock pulses as count inputs and provides counts in binary notation. Since this binary counter continuously outputs counts, such counter may be used in the field of sequence control, for example, in which a plurality of components are successively actuated according to the above counts.

However, the conventional counter has a limited application since its output is successively incremented or decremented one by one, the counter being unable to jump certain predetermined counts.

Assume, for example, that counts 0-5 (decimal numbers) of the counter are used as signals to determine timing for actuating components of system A, counts 6-10 (decimal numbers) for actuating components of system B and counts 11-15 (decimal numbers) for actuating components of system C. Each component is in one-to-one relationship with a count of the counter.

Where the components of systems A, B and C are actuated successively, sequence control may be effected by using the counter. However, the conventional counter cannot be used as a timing generator or a component selecting signal generator for a control system which successively actuates the components of systems A, B and C under certain conditions but successively actuates only those of systems A and C under others.

To cope with such a situation, possible consideration is to provide counters for the respective systems A, B and C and switch from one counter to another. However, this would require a control device for the switching, resulting in a large and complicated counter device. Even if such devices were used, components to be maintained inactive would be determined in a fixed manner by a timer, which makes it impossible to obtain a flexible control system configuration allowing variable the components to be maintained inactive.

A serially accessible memory such as a field or frame memory is used in the field of image processing. In such a memory, a counter device such as a program counter is used as an address generator to generate a row or column designating signal for selecting a word line or a bit line. The following problem arises in such a memory. Assume a screen split up into three image areas A, B and C. The screen may be split up vertically or horizontally, and here it is assumed that the screen is split up vertically into three parts as shown in FIG. 4. In the case of a field memory or a plane memory in FIG. 4, the word lines WL correspond to horizontal scan lines on the screen, and are successively selected in accordance with counter outputs.

In a field memory of FIG. 4, pixels on the screen are generally corresponding in one-to-one mapping relation to the bits (memory cells) in a memory cell array 950. A counter/decoder 951 selects a word line WL from a memory cell array 950 in response to a clock signal φc. In other words, the counts of the counter are used as row addresses. If, in the course of image editing, it is desired to process data by reading the data for the image areas A and C only, omitting the image area B, it is necessary to apply word line designating signals from outside since the conventional counter cannot be used as an address generator in such a case, which makes a high-speed word line selection impossible. More specifically, the counter/driver 951 can not jump-from a word line WLa of the last word line in the area A to a word line WLb of the first word line in the area C in one clock cycle.

If the counter/decoder 951 is employed to jump the area A (word line WLa) to the area C (word line WLb), it is required to disable the data read/write operation of the memory device while the clock signal φc is applied to the counter/decoder successively by a certain number of times to set an output of the counter/decoder corresponding to the word line WLb. This scheme degrades data processing performance.

When, during a data writing operation, it is desired to update the data for the image areas A and C, leaving the data for the image area B unchanged, the same problem arises since the conventional counter cannot be used as a row address generator. Also where the screen is split up horizontally, the same problem arises if a counter is used for generating bit line selecting addresses.

In the absence of the count jumping function, i.e. a function to jump from one count to another, as described above, the conventional counter has the disadvantage of having a limited application in that it cannot be used for applications requiring such count jumping actions.

As described above, where an address counter only operates in response to a clock signal and it is not provided with a jumping function, a memory device with such an address counter may only employable as a buffer memory.

In image data processor, such a buffer memory is frequently employed. A typical use of such a buffer memory on an image data processor is shown in FIG. 5.

FIG. 5 is a block diagram of an interframe comparison type comb filter. Referring to FIG. 5, a frame buffer 910 receives a composite video signal, and delays received composite video signal by one frame period. The frame buffer 910 is a first-in, first-out memory, and serves as a one frame delay element.

An adder 911 receives current composite video signal at its positive input and an output of the frame buffer 910 at its negative input. The adder 911 serves as a subtractor for subtracting, from current video signal, video signal preceding by one frame period to the current video signal.

An amplifier 912 has an amplification rate of ½ and serves as a divider by a factor of 2.

A bandpass filter 913 passes only a desired frequency components from received signal from the amplifier 912. The bandpass filter 913 has a pass band of 3.58 MHz and produce a chrominance signal C.

An adder 914 receives an output of the bandpass filter 913 at its negative input and the current video data at its positive input. The adder 914 serves as a subtractor for subtracting the output of the bandpass filter 913 or a chrominance signal from current composite video signal to produce a luminance signal.

FIG. 6 shows schematically an overall structure of a FIFO type memory device. The memory device can perform asynchronously data read operation and data write operation.

Referring to FIG. 6, the FIFO type memory device includes a memory cell array 801 having a plurality of memory cells arranged in rows and columns, and a row decoder 802 for decoding a row address received from a selection control unit 804 to select a corresponding row in the memory cell array 801. The selection control circuit 804 passes either of outputs of a read row address counter 806 and a write row address counter 808.

The read row address counter 806 increments its count by 1 in response to a first read clock signal $\phi R1$ from a read-out clock generator 810. The read-out clock generator 810 generates the first clock $\phi R1$ and a second read clock signal $\phi R2$ in response to externally applied read enable signal RE and read control signal $\phi R$.

The read-out clock generator 810 gates the read clock signal $\phi R$ to generate the second read clock signal $\phi R2$, and also generates the first read clock signal $\phi R1$ when the read clock $\phi R$ is applied thereto by the times of the number of columns of the array 801.

The write row address counter 808 increments its count by 1 in response to the reception of a first write clock signal $\phi W1$ from a write-in clock generator 812 which in turn generates the first write clock signal $\phi W1$ and a second write clock signal $\phi W2$ in response to externally applied write enable signal WE and write control signal $\phi W$.

The second write clock signal $\phi W2$ is generated by gating the write clock signal $\phi W$ by the write enable signal WE. The first write clock signal $\phi W1$ is generated when the second write control signal $\phi W2$ is generated by the times of the number of the columns in the array 801.

The memory device of FIG. 6 also includes a serial read counter 814 for generating a column select signal in response to the second read clock signal $\phi R2$, a read-out buffer 816 for storing data of one row of the array 801, and an output buffer 818 for receiving data from the read-out buffer 816 to produce an external read-out data Dout. The serial read counter 814 includes a read column address counter 834 for counting the second read clock signal $\phi R2$ to generate a read column address, and a read decoder 832 for decoding a read column address from the read column address counter 834 to generate a column select signal.

The read-out buffer 816 includes a plurality of storage elements corresponding in number and position to the columns of the array 801 and connects sequentially the storage elements to the output buffer 818 in response to the column select signal from the read decoder 832.

The memory device further includes a serial write counter 820 for generating a write column select signal in response to the second write clock signal $\phi W2$, and a write-in buffer 822 for storing write-in data of one row to the array 801 received from an input buffer 824. The input buffer 824 produces write-in data from externally applied write-in data. The write-in buffer 822 includes a plurality of storage elements corresponding in number and position to the columns of the array 801. The write-in buffer 822 connects sequentially the storage elements therein to the input buffer 824 in response to the column select signal received from the serial write-in counter 820.

The serial write-in counter 820 includes a write column address counter 838 for counting the second write-in clock signal $\phi W2$ to generate a write column address, and a write decoder 836 for decoding a write column address from the write column address counter 838 to generate a write column select signal.

The selection control circuit 804 arbitrates between a read row selection and a write row selection, controls sensing operation in the array 801, and also controls the data transfer between the array 801 and the read-out buffer 816 and between the array 801 and the write-in buffer 822. Now operation of the memory device will be briefly described.

In data writing operation, the write enable signal WE is brought into an active state. The write-in clock generator 812 is made active in response to the activated write enable signal WE to generate the first and second write clock signals $\phi W1$ and $\phi W2$. The write column address counter 838 counts the second write clock signal $\phi W2$, and supplies its count to the write decoder 836 as a write column address. A storage element in the write-in buffer 822 selected by the write decoder 836, or designated by a write column address from the decoder 836, is connected to the input buffer 824 to receive and store write-in data.

The write-in clock generator 812 generates the first write clock signal $\phi W1$ at an appropriate timing in response to the write clock $\phi W$. The write-row address counter 808 generates a write row address in response to the first write control signal $\phi W1$. The selection control unit 804 detects the transition of the output of the write-row address counter 808 to pass the write row address from the counter 808 to the row decoder 802. The row decoder 802 selects in the array 801 a row corresponding to the received row address. When the write-in buffer 122 receives and stores one row amount of data, the selection control unit 804 connects the write-in buffer 822 and the array 801, so that data in the write-in buffer 822 are transferred in parallel to memory cells on the selected row in the array 801.

In data reading operation, the read enable signal RE is brought into an active state to activate the read-out clock generator 810. The first read clock signal $\phi R1$ is generated from the read-out clock generator 810 to be applied to the read-row address counter 806. The read-row address counter 806 increments its count by 1 every receipt of the first read clock signal $\phi R1$. When the selection control unit 804 detects the transition of the count of the counter 806, it passes through the output or the count of the read-row address counter 806 to provide the same to the row decoder 802 as a read row address. The row decoder 802 selects a row corresponding to thus received row address from the counter 806 in the array 801.

After selection of the row and assertion of data potential on each column, the array 801 is connected to the read-out buffer 816 under the control of the selection control unit 804, so that data of a selected row in the array 801 are transferred from the array 801 to the read-out buffer 816.

Then, the read-out clock generator 810 generates the second read clock signal $\phi R2$ to provide the same to the read column address counter 834. The read column address counter 834 increments its count by 1 every receipt of the second read clock signal $\phi R2$, and provides its count to the read decoder 832 as a read column address. The read decoder 832 connects sequentially the storage elements of the read-out buffer 816 to the output buffer 818 in response to received read column addresses.

When the read enable signal RE and the write enable signal WE are both active, the selection control unit 804 arbitrates between read row selecting operation and write row selecting operation. In general, read row selecting operation is first performed and then write row selecting operation is performed in one clock cycle if the clock signals $\phi R1$ and $\phi W1$ are synchronized with each other. If the clock signals $\phi R1$ and $\phi W1$ are asynchronous with each other, the selection control unit 804 selects first a row address generated earlier. The selection control unit 804 also monitors a read row address and a write row address to prevent the read row address from being in advance of the write row address.

With such a FIFO type memory device, video data of raster scan system can be processed at a fast rate. When the read clock $\phi R$ and the write clock $\phi W$ are synchronous with each other, the memory device serves as a delay element such as a field delay element or a frame delay element.

In such a memory device used in video application, data sequence in data reading operation should be made the same as that in data writing operation. Thus, a conventional redundancy scheme cannot be employed for repairing a defective memory cell (a defective bit).

FIG. 7 shows a structure of a memory device with a conventional redundancy scheme. In FIG. 7, only circuitry related to defective row repairing is shown. Referring to FIG. 7, a row decoder RD and a spare row decoder correspond to the row decoder 802 shown in FIG. 6, and a row address counter RAD corresponds to the read-row address counter 806 or the write-row address counter 808 shown in FIG. 6. The memory cell array 801 of FIG. 6 includes a memory cell array MA and a redundant array MR of FIG. 7. The redundant array MR includes one or more redundant word lines for repairing a defective word line having a defective memory cell in the memory cell array MA.

The spare row decoder SRD stores a defective row address indicating a defective row in the memory cell array MA. The programming of the defective row address is performed by blowing off one or more fuse elements provided in the spare row decoder SRD with a laser beam, for example.

The output of the row address counter RAD is supplied both to the row decoder RD and to the spare row decoder SRD. When a row address from the counter RAD designates a normal row in the array MA, the row decoder RD decodes the received row address to select a corresponding row in the array MA. The spare row decoder SRD does not generate an active signal (redundant row selecting signal), and no redundant word line is selected in the redundant array MR.

If a row address from the row address counter RAD designates the defective row in the memory cell array MA, the spare row decoder SRD generates a redundant row selecting signal to select a corresponding redundant row in the redundant array MR because the row address from the row address counter RAD coincides with the stored defective row address in the spare row decoder SRD. The spare row decoder SRD also generates a normal element disable signal NED to deactivate the row decoder RD for inhibiting row selection in the memory cell array MA. In other words, the row decoder RD performs decoding operation according to the received row address until the normal element disable signal NED is generated.

According to the redundancy scheme, a defective row (word line) WLD is replaced with a redundant row WLR as shown in FIG. 8 (a), so that the defective word line WLD is equivalently repaired.

However, in the shown redundancy scheme, the row decoder RD is once activated, and then it is deactivated in response to the normal element disable signal NED. Thus, there is a time period in which the defective row is activated in the memory cell array MA to connect the memory cells thereon to respective columns. In order to avoid data contention on the columns between data of the defective row and data of the redundant row, it is necessary to wait for the activation of the redundant row until the defective row is deactivated, resulting in increased access time.

In addition, the mapping of video data in the memory cell array MA is in general the same as that on a display screen CRT as shown in FIG. 8. With the above described redundancy scheme, such a correspondence in mapping can not be maintained.

For a certain application, such destruction in mapping correspondence may not be a problem as far as a row word line selection is concerned because it can not be seen from an outer world how row addresses are made correspondent to physical dispositions of rows in a memory cell array.

However, in a video application video data are serially input and output to and from a memory, and the sequence of video data is required to be the same in input data and output data. Therefore, the above described redundancy scheme can not be applied to the very column repairing scheme.

Possible scheme for accommodating such a difficulty in column repairing may be that as shown in FIG. 9. In FIG. 7 a defective column line CLD having connected thereto defective memory cell is indicated by the mark "x" is replaced with a redundant column CLR. A storage element a2 is connected through a transfer gate transistor TG2 to the redundant column CLR. With the repairing scheme, the sequence of video data a1 to an is maintained in data inputting and in data outputting.

However, in the scheme, the redundant column CLR is connected through a long interconnection line IL to the transfer gate transistor TG2, and it takes longer time for data transfer between the storage element a2 and the redundant column CLR as compared to any other normal column-to-storage element data transfer, deteriorating fast operability.

In order to connect the redundant column CLR to the transistor TG2, fuse elements may be employed, and fuse elements between the transfer gate transistors for normal columns and the interconnection line IL may be blown off with a laser beam, as has been done in programming a ROM. However, it is difficult in practice to execute correctly such a repairing interconnection technique because there are many fuse elements to be blown off, leading to reduction in product yield.

SUMMARY OF THE INVENTION

An object of this invention is to eliminate the drawback of the conventional counter described above and provide a counter device having a count jumping function.

Another object of this invention is to provide a counter device having a jumping function, which has a count jumping range and a jump starting count set as desired.

A further object of this invention is to provide a counter device having an improved operating method.

A further another object of the present invention is to provide a semiconductor memory device with an improved redundancy scheme for repairing a defective bit without deteriorating the fast operability and product yield thereof.

A still another object of the present invention is to provide a method for repairing a defective bit without degrading the fast operability and the product yield of a semiconductor memory device.

A still further another object of the present invention is to provide a method for operating a semiconductor memory device with a redundancy scheme for repairing a defective bit.

A counter device according to this invention comprises counting circuitry for counting clock pulses, a comparing circuitry for comparing a count provided by the counting circuitry with a predetermined first count, and varying circuitry for varying the count of the counting circuitry by a predetermined second count in response to an equality detection signal received from the comparing circuitry.

The comparing circuitry detects a count jump starting position of the counting circuitry and, in response to detection of the jump starting position, the varying circuitry causes the counting circuitry to carry out a counting operation with the predetermined second count jumped. The counting circuitry resumes counting from the jumped count, and the count or counts between the first predetermined count and the count varied by the varying circuitry is/are always jumped without being counted.

The memory device of the invention has the counter described above embedded therein as an address counter.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 16A through 16D illustrate an operation manner of the counter device shown in FIG. 15.

DESCRIPTION OF THE PREFERRED EMBODIMENTS

Figure 10:
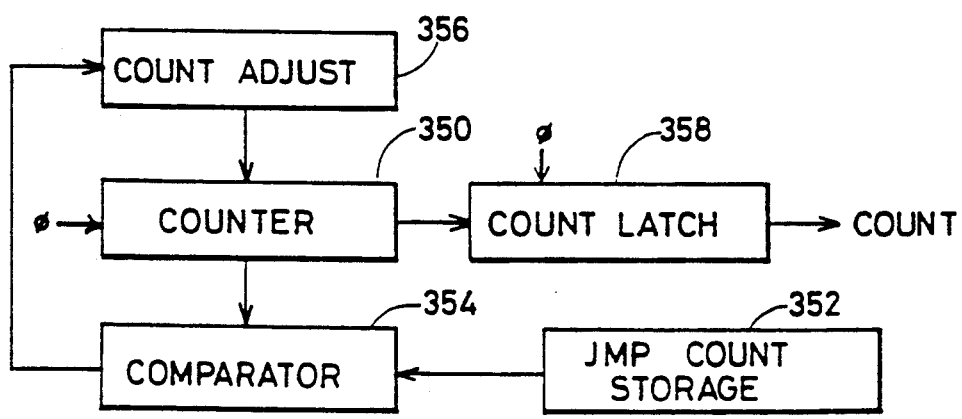
FIG. 10 shows functionally a structure of a counter device according to an embodiment of the invention.

FIG. 10 is a functional block diagram representing functionally a structure of a counter device of the present invention. Referring to FIG. 10, the counter device of the present invention includes an asynchronous or ripple counter unit 350 for counting a clock signal $\phi$, a jump count storage unit 352 for storing a count to be jumped, a comparator 354 for comparing a count of the counter unit 350 and a stored count in the jump count storage unit 352, a count adjust unit 356 in response to an output of the comparator 354 for adjusting a count of the counter unit 350, and a count latch unit 358 in response to the clock signal for latching or passing therethrough a count of the counter unit 350.

In operation, the counter unit 350 counts the clock signal $\phi$ and provides its count as the output. The jump count storage unit 352 has already stored therein a count to be jumped. When a count of the counter unit 350 coincides with the count to be jumped in the storage unit 352, the comparator 354 generates a signal indicating the coincidence. The count adjust unit 356 inverts in value the least significant count bit of the counter unit 350 when it receives the coincidence indicating signal from the comparator 354. If this inversion of the least significant count bit generates a ripple carry, the counter unit 350 has its count automatically adjusted according to thus generated ripple carry, so that the count of the counter unit 350 is modified to jump the count to be jumped. Thus, jumping operation by one bit (count value) is achieved. The count latch 358 passes through the count of the counter unit 350 after the count thereof is stably established.

Figure 11:
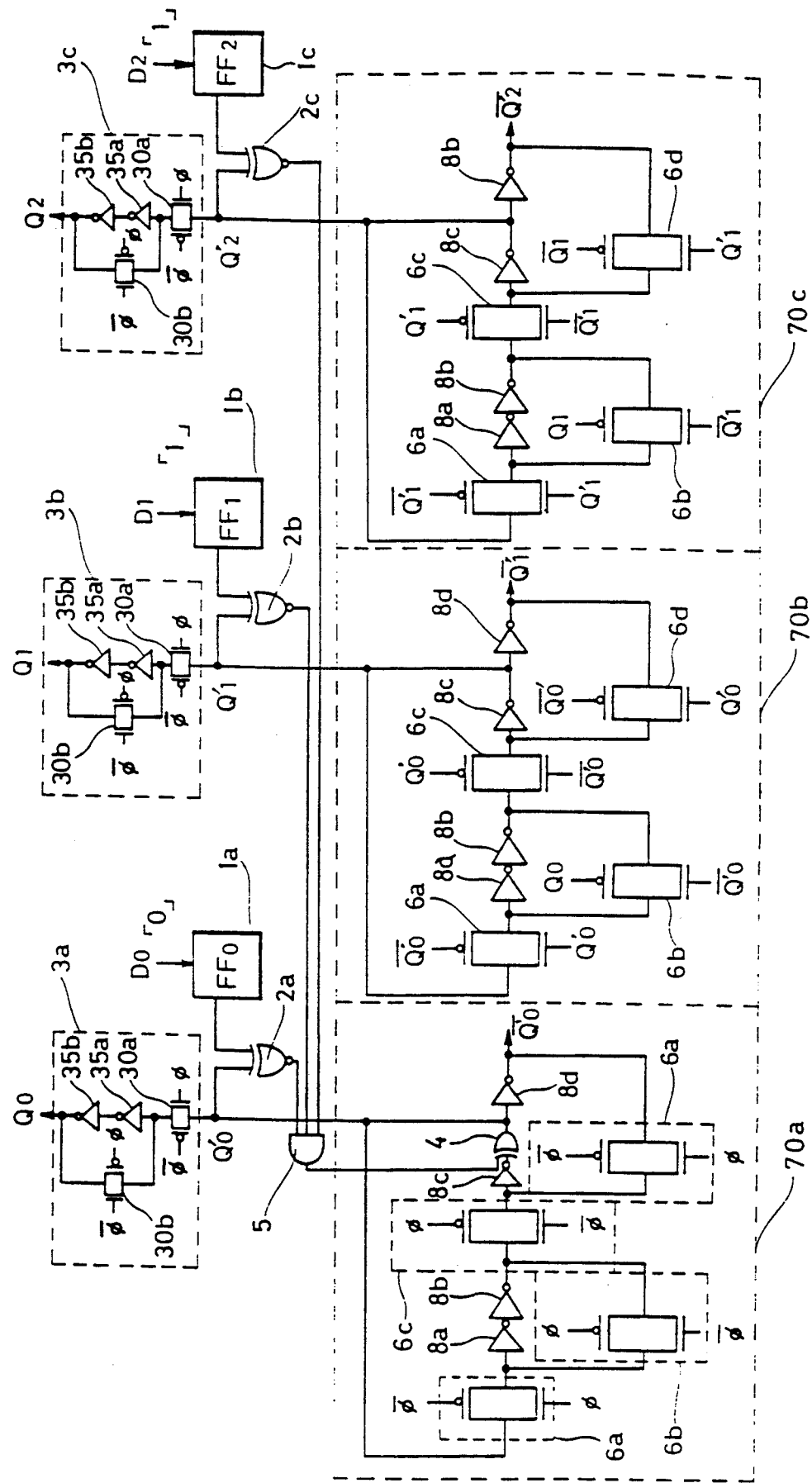
FIG. 11 is a view showing specifically a counter device according to one embodiment of this invention.

FIG. 11 is a diagram showing specifically a structure of a counter device according one embodiment of this invention. In FIG. 11, the counter device includes three one-bit binary counters 70a, 70b and 70c connected in same construction as the one-bit binary counter 7 shown in FIG. 1. The binary counter 70a at the first stage has the same construction as the binary counter 7 shown in FIG. 1 except that an exclusive OR (ExOR) circuit 4 is provided between the inverter 8c and inverter 8d in the second-stage latch block. Like reference numerals are used to identify like elements of the binary counters 70a-70c and of the one-bit binary counter 7 shown in FIG. 1.

The three staged binary counters 70a, 70b, and 70c correspond to the counter unit 350 of FIG. 10, and the exclusive OR circuit 4 corresponds to the count adjust unit 356 of FIG. 10.

This counter device further includes flip-flops 1a, 1b and 1c for storing a jump code signifying a jump starting count, and ExNOR (exclusive negative OR) gates 2a, 2b and 2c and an AND gate 5 for detecting equality/unequality between outputs (counts) of the counters 70a-70c and the jump code stored in the flip-flops 1a-1c.

The flip-flops 1a, 1b and 1c correspond to the jump count storage unit 352, and the exclusive NOR gates 2a, 2b, 2c and AND gate 5 correspond to the comparator 354 of FIG. 10.

The flip-flops 1a-1c are associated with the counters 70a-70c, respectively. The flip-flop 1a stores the least significant bit D0 of the jump code, the flip-flop 1b a second bit of the jump code, and the flip-flop 1c the most significant bit of the jump code.

The ExNOR gate 2a compares output $Q'0$ of the counter 70a and bit D0 stored in the flip-flop 1a. The ExNOR gate 2b compares output $Q'1$ of the counter 70b and bit D1 stored in the flip-flop 1b. The ExNOR gate 2c compares output $Q'2$ of the counter 70c and bit D2 stored in the flip-flop 1c.

The AND gate 5 receives outputs of the ExNOR gates 2a-2c. Output of the AND gate 5 is applied to one input of the ExOR gate 4 in the counter 70a. The ExOR gate 4 receives the output of the inverter 8c at the other input. The AND gate 5 outputs a signal indicating an equality between the jump code and the count of the counters 70a-70c when the ExOR gates 2a-2c all indicate equality. The ExOR gate 4 acts as an inverter when an "H" signal is applied to one of its inputs. That is, the ExOR gate 4 acts as an adding circuit for adding binary value "1" to the count when the jump starting count is reached.

Figure 12:
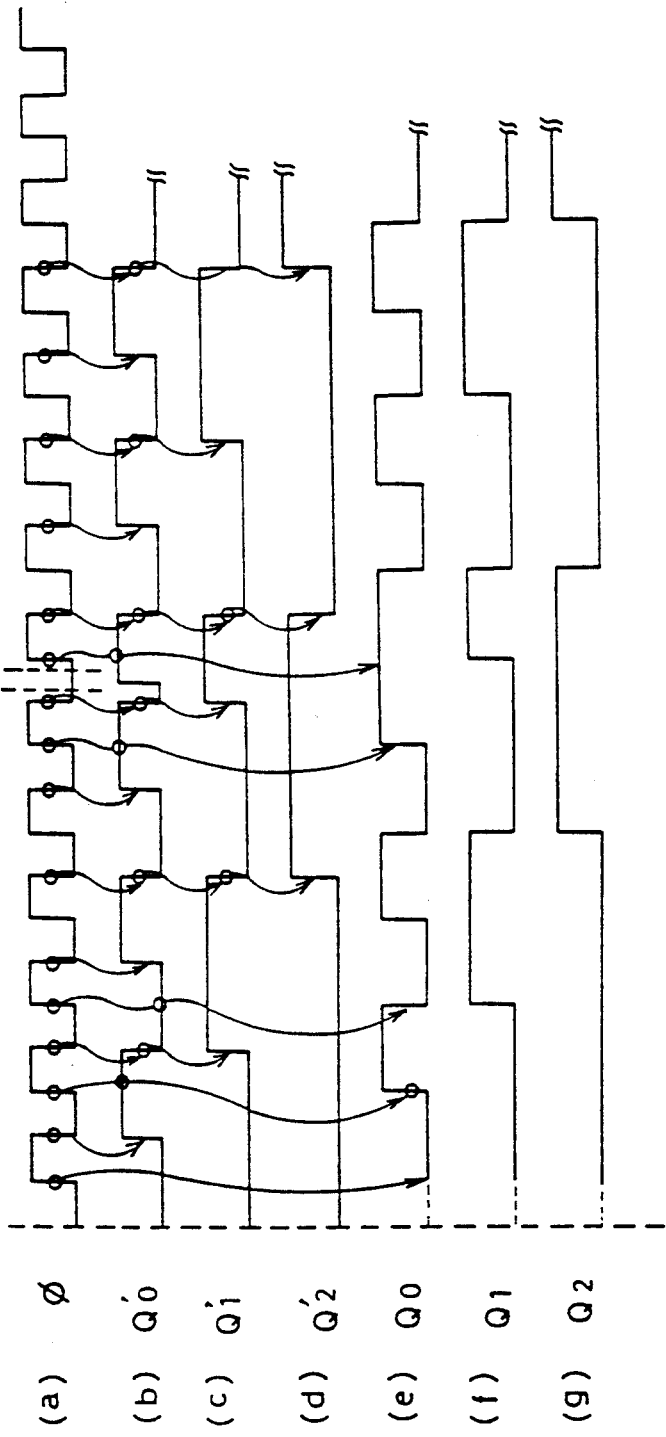
FIG. 12 is a waveform diagram illustrating an operation of the counter device shown in FIG. 11.

In order to avoid output instability occurring at a time of count jump, this counter device further includes counter output retaining latches 3a, 3b and 3c for outputting the output bits of the respective counters 70a-70c at the same timing. These latches 3a, 3b and 3c correspond to the output latch of FIG. 10. Each of the latches 3a-3c has a similar construction to the first-stage latch included in each of the one-bit counters 70a-70c. Each of latch 3a, 3b and 3c includes a transmission gate 30a for receiving the output bit from the corresponding counter, two inverters 35a and 35b connected in series for receiving output of the transmission gate 30a, and a transmission gate 30b for coupling an input of the inverter 35a and an output of the inverter 35b for providing a latching function. The transmission gate 30a turns on when a clock signal $\phi$ is in "H" level, whereas the transmission gate 30b turns on when a clock signal $\bar{\phi}$ is in "L" level. The output retaining latch 3a latches and outputs the output bit $Q'0$ of the counter 70a, the output retaining latch 3b latches and outputs the output bit $Q'1$ of the counter 70b, and the output retaining latch 3c latches and outputs the output bit $Q'2$ of the counter 70c. The way in which the counter device shown in FIG. 11 operates will be described with reference to FIG. 12 showing its operational waveforms.

It is assumed that the output bits $Q'1$, $Q'1$ and $Q'2$ of the counters 70a-70c are all "L" until the clock signal $\phi$ is applied as a count input. Desired binary values constituting a jump code are set to the flip-flops 1a-1c beforehand. Assume that, for example, "0" is stored in the flip-flop 1a, "1" in the flip-flop 1b, and "1" in the flip-flop 1c as shown in FIG. 11. In this state, "110" (binary) is set as a count to be jumped.

Figure 1:
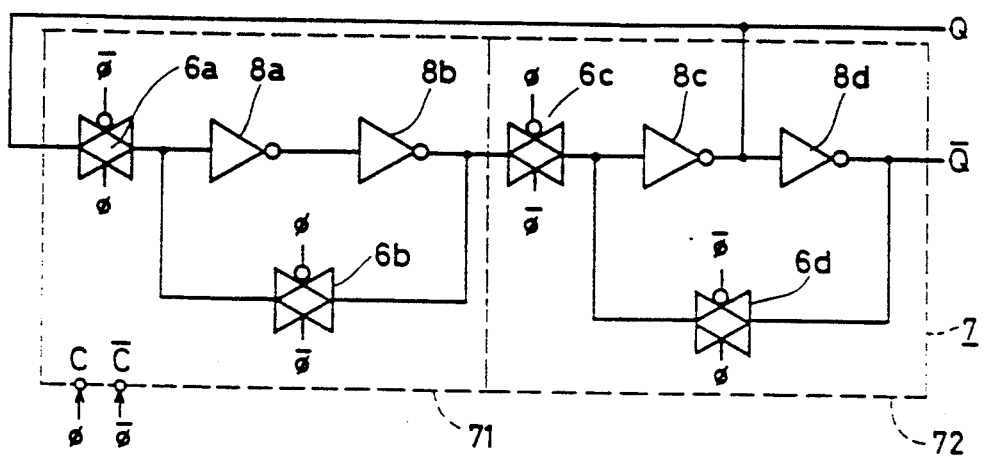
FIG. 1 is a view showing one example of conventional binary counters.
Figure 2:
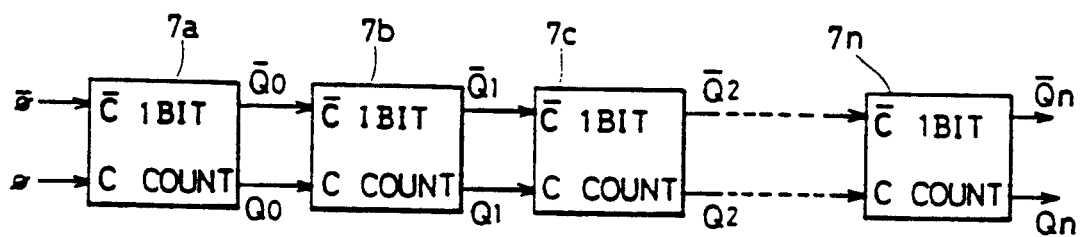
FIG. 2 is a view showing a counter device including a plurality of binary counters as shown in FIG. 1 connected in series.
Figure 3:
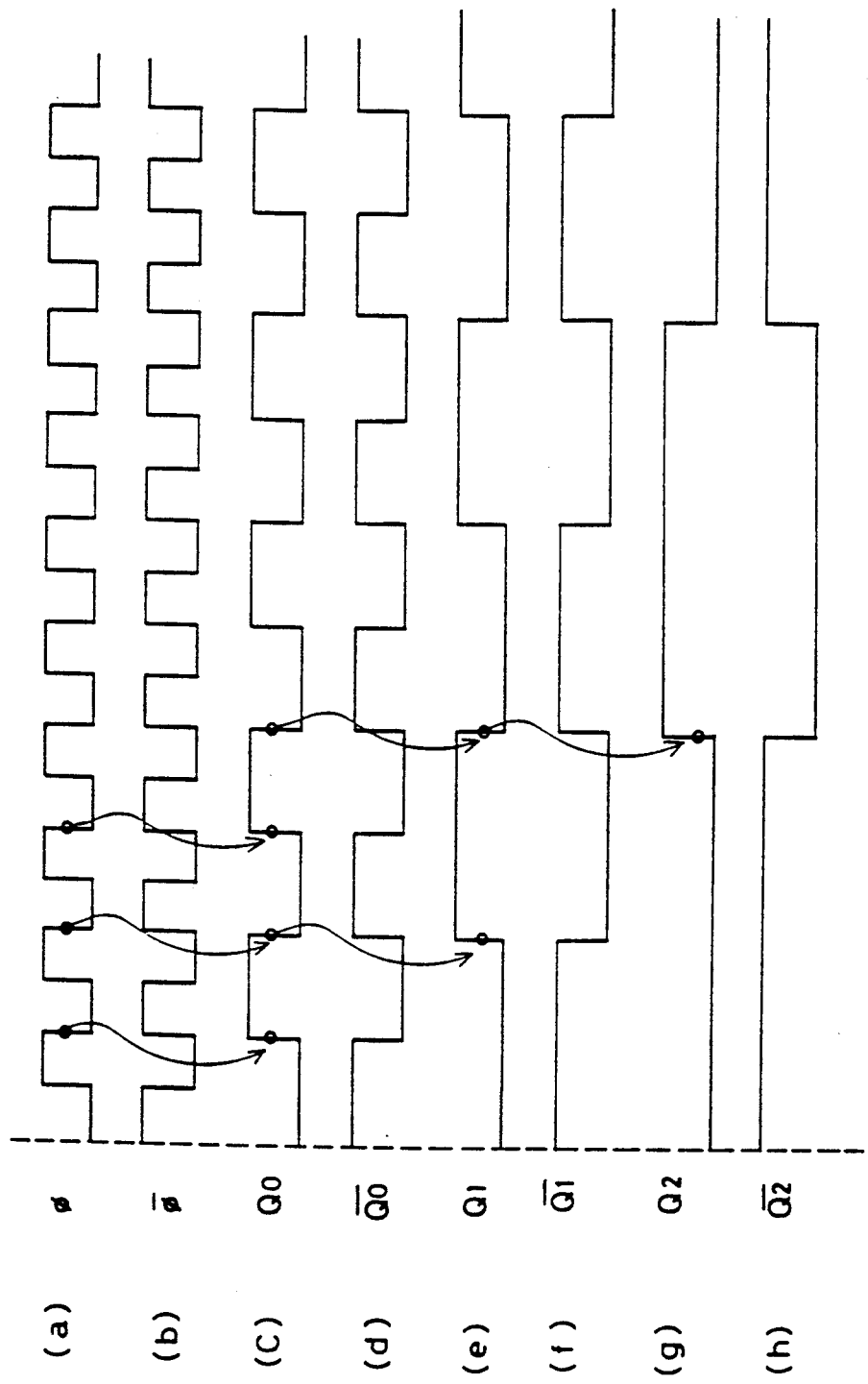
FIG. 3 is a waveform diagram illustrating an operation of the counter device shown in FIGS. 1 and 2.
Figure 4:
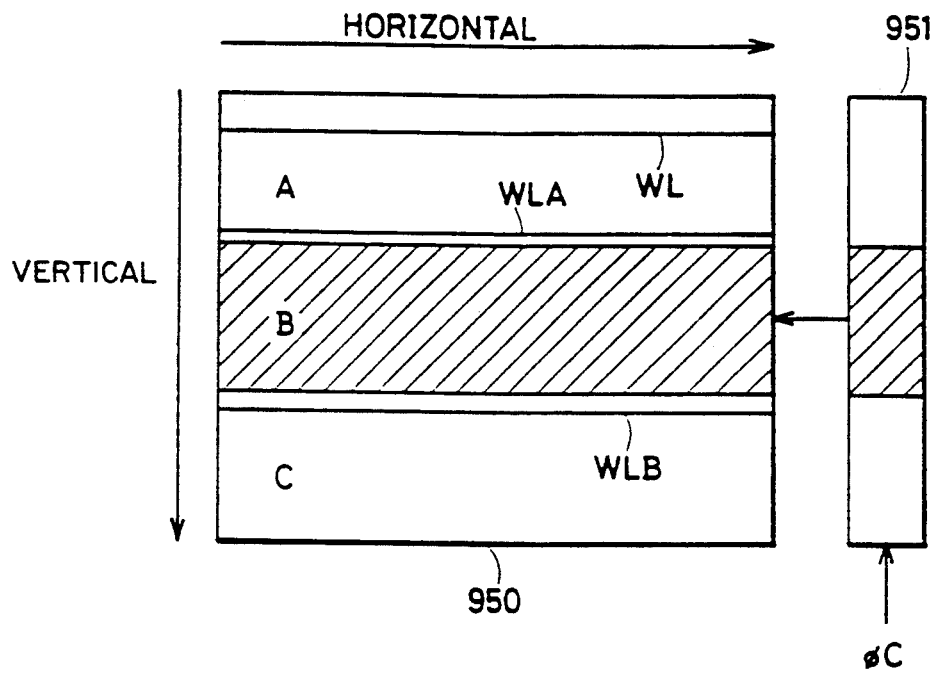
FIG. 4 is a diagram for explaining a disadvantage of a conventional memory device with an address counter.
Figure 5:
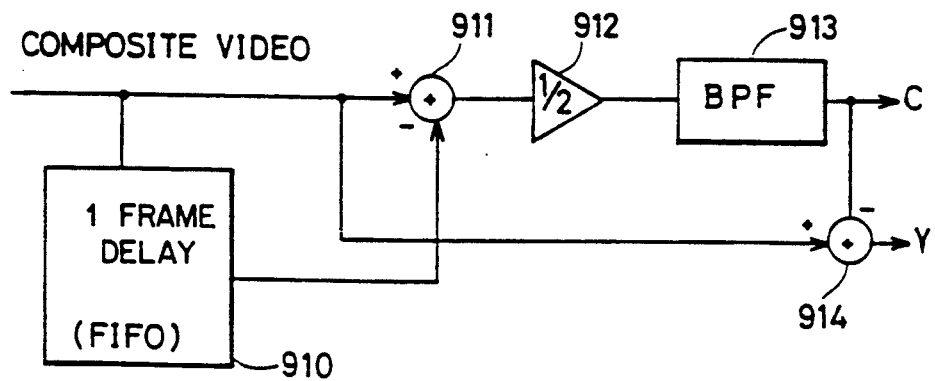
FIG. 5 is a block diagram representing a video data processing unit including a memory device as a delay element.

The basic operation of the counters 70a-70c is the same as that of the conventional binary counter described with reference to FIGS. 1 through 3. That is, clock pulses are counted each time the clock signals $\phi$, $\bar{\phi}$ are input.

Before counts of the counters 70a-70c reach the jump code "110", i.e. up to "101", at least one of the outputs of the ExNOR gates 2a-2c is in "L" level signifying unequality. Thus, the AND gate 5 outputs an "L" signal. This causes the ExOR gate 4 to act as a buffer to apply the signal transmitted from the inverter 8c as it is to the inverter 8d.

The respective counter output retaining latches 3a-3c accept and supply the output bits $Q'0-Q'2$ each time the clock signal $\phi$ is applied thereto (or rises to "H"), and latch the output bits each time the clock signal $\bar{\phi}$ is applied.

Assume that the count of the counters 70a-70c has reached "110", that is to say the clock signal $\phi$ has been applied six times. At this time, the output bits $Q'2$, $Q'1$ and $Q'0$ of the counters 70a-70c equal the jump code "110". Then the ExNOR gates 2a-2c generate "H" outputs signifying equality, which are applied to the AND gate 5. The AND gate 5 has the three inputs all in "H" level, and outputs an "H" signal. With the "H" signal applied to one of the inputs, the ExOR gate 4 functions as an inverter to invert the output of the inverter 8c. As a result, the output bit $Q'0$ changes from "L" level to "H" level.

In the second counter 70b, the transmission gate 6d in the second-stage latch block turns on only to render the output data established even with the change of output bit $Q'0$ from "L" level to "H" level, wherefore its output bit $Q'1$ remains unchanged, and so does the output bit $Q'2$. Consequently, the count "110" of the counters 70a-70c is changed to "111" immediately. The counter output retaining latches 3a-3c accept and output the output bits $Q'0-Q'2$, respectively, in response to the rise from "L" to "H" of the clock signal $\phi$. Thus, the counter device outputs counts in a stable manner, with the change of the output bit $Q'0$ of the counter 70a exerting no influence on outputs Q0-Q2 of the counter device. The count determined by the outputs Q1-Q2 of the counter device is varied in response to the rise of the clock signal φ. On the other hand, the output bits Q'0–Q'2 of the counters 70a–70c are varied with a delay of a half clock period after the rise of the clock signal φ.

Thus, as seen from FIG. 12, when the count of the counters 70a–70c reaches the jump code "110", this count is not reflected in the output bits Q2–Q0. In other words, the count is changed from "101" to "111", jumping the count "110".

This counter device is operable as an ordinary binary counter if jumping/non-jumping control signals are applied to an input of the AND gate 5 to control enable/disable of the AND gate 5.

A plurality of jump codes may be set although only one type of jump code is set in the embodiment shown in FIG. 11.

Figure 13:
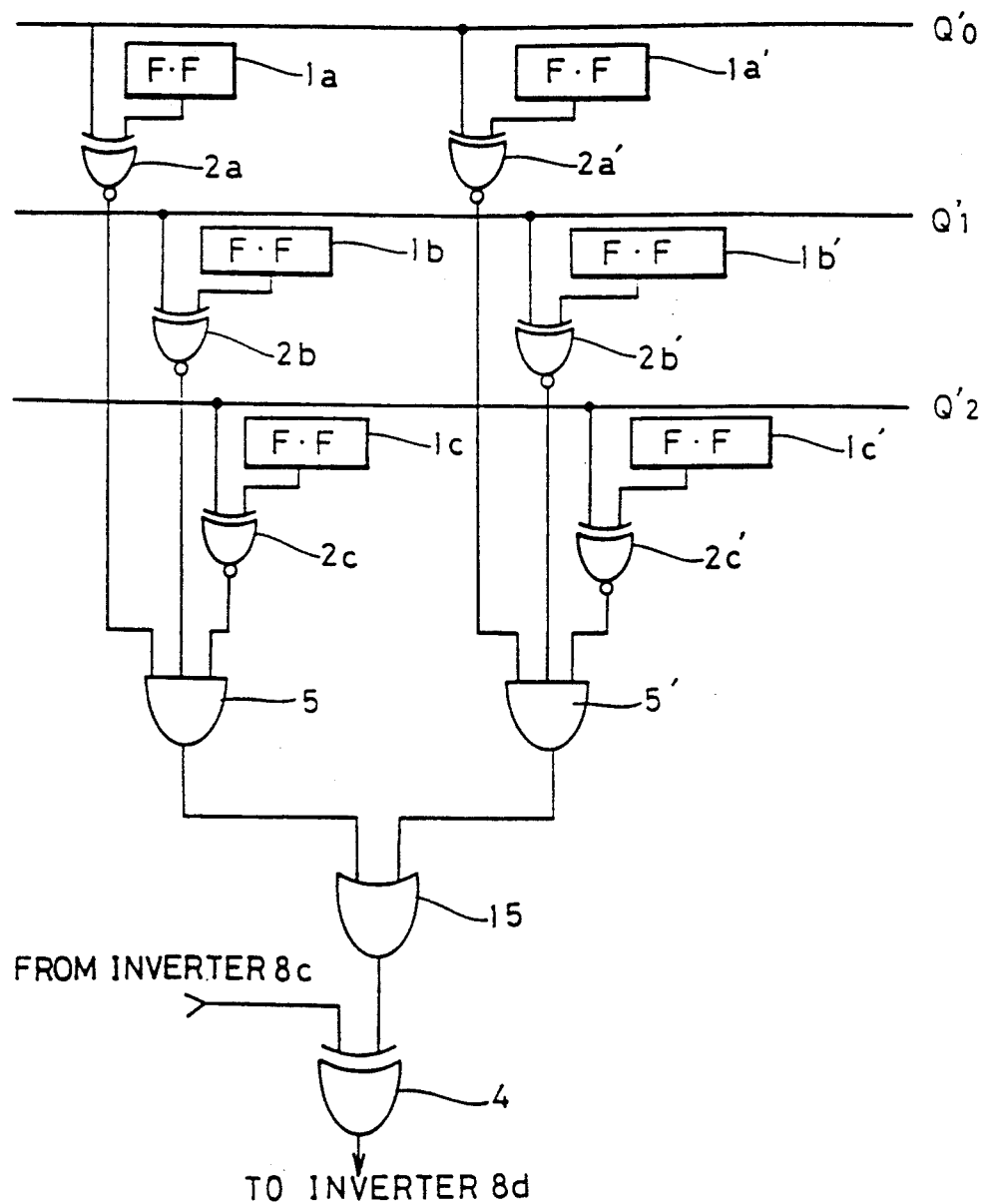
FIG. 13 is a diagram showing a counter device according to another embodiment of this invention.

FIG. 13 is a diagram showing the construction of a count varying block of a counter device according to another embodiment of this invention. In FIG. 13, the count varying block includes flip-flops 1a–1c for storing a first jump code, and flip-flops 1a', 1b' and 1c' for storing a second jump code. Further, ExNOR gates 2a–2c and an AND gate 5 which receives outputs of the ExNOR gates 2a–2c are provided for detecting equality/unequality between the first jump code and output bits Q'0–Q'2 of counters 70a–70c. The ExNOR gate 2a compares the output Q'0 and the bit stored in the flip-flop 1a. The ExNOR gate 2b compares the output Q'1 and the bit stored in the flip-flop 1b. The ExNOR gate 2c compares the output Q'2 and the bit stored in the flip-flop 1c. The AND gate 5 outputs a signal indicating an equality between the jump code and the counter output bits when the ExNOR gates 2a–2c are all in equality.

The flip-flops 1a', 1b' and 1c' are provided for storing the second jump code. Further, ExNOR gates 2a', 2b' and 2c' and an AND gate 5' are provided for detecting equality/unequality between the second jump code and output bits Q'0–Q'2. The ExNOR gate 2a, compares the output Q'0 and the bit stored in the flip-flop 1a'. The ExNOR gate 2b, compares the output Q'1 and the bit stored in the flip-flop 1b'. The ExNOR gate 2c, compares the output Q'2 and the bit stored in the flip-flop 1c'. The AND gate 5' receives outputs of the ExNOR gates 2a'–2c'.

An OR gate 15 is provided for indicating that the counter output bits Q'0–Q'2 equal either of the first and second jump codes. Output of the OR gate 15 is applied to one of the inputs of the ExOR gate 4. This OR gate 15 generates an equality signal when either of the AND gates 5 and 5' shows an equality.

Thus, by using the count varying block shown in FIG. 13, a counter device may be constructed to carry out a counting operation with jumping of two different counts. A desired number of jump codes may be set by extending the illustrated construction in a parallel way, to obtain a counter device which carries out a counting operation with jumping of a plurality of counts.

While, in the above embodiment, the counter device jumps only those counts which equal the jump codes, it is possible to modify the construction for jumping a plurality of bits from a jump code.

Figure 14:
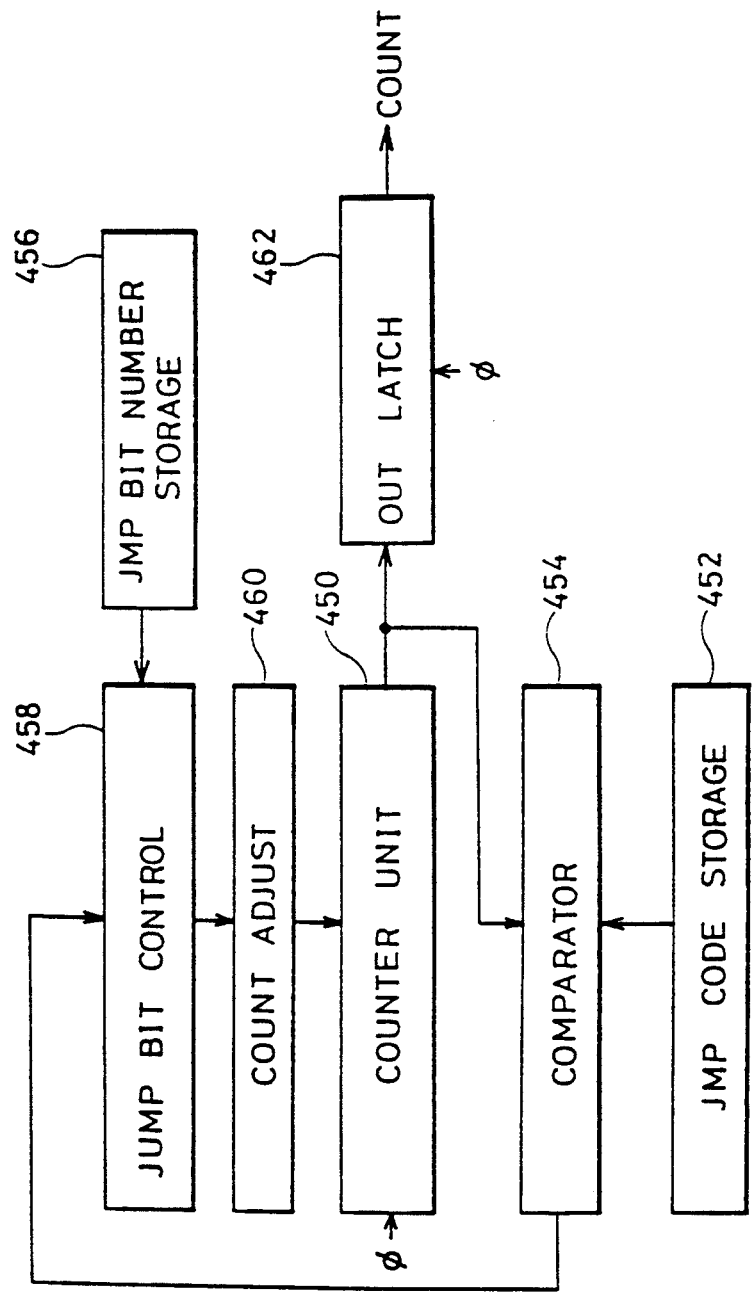
FIG. 14 shows functionally a structure of a counter device according to another embodiment of the invention.

FIG. 14 shows functionally a structure of a counter device according to a further embodiment of the present invention. Referring to FIG. 14, the counter device includes a counter unit 450 for counting a clock signal φ, an output latch unit 462 for latching a count of the counter unit 450 in response to the clock signal φ, a jump code storage unit 452 for storing a jump code indicating a start count to be jumped, and a comparator 454 for comparing a count of the counter unit 454 and the jump code in the jump code storage unit 452.

The counter device further includes a jumping bit number storage unit 456 for storing the number of bits (counts) to be jumped, a jump bit control unit 458 responsive to an output of the comparator 454 for controlling a bit jumping operation according to the jumping bit number in the storage unit 456, and a count adjust unit 460 for adjusting a count of the counter unit 450 under the control of the jump bit control unit 458.

The jump bit number storage unit 456 stores the number of bits to be jumped in binary representation, and the jump bit control unit 458 controls the count adjusting operation so that a count of the counter unit 450 may be modified from the most significant count bit to the least significant count bit.

Figure 15:
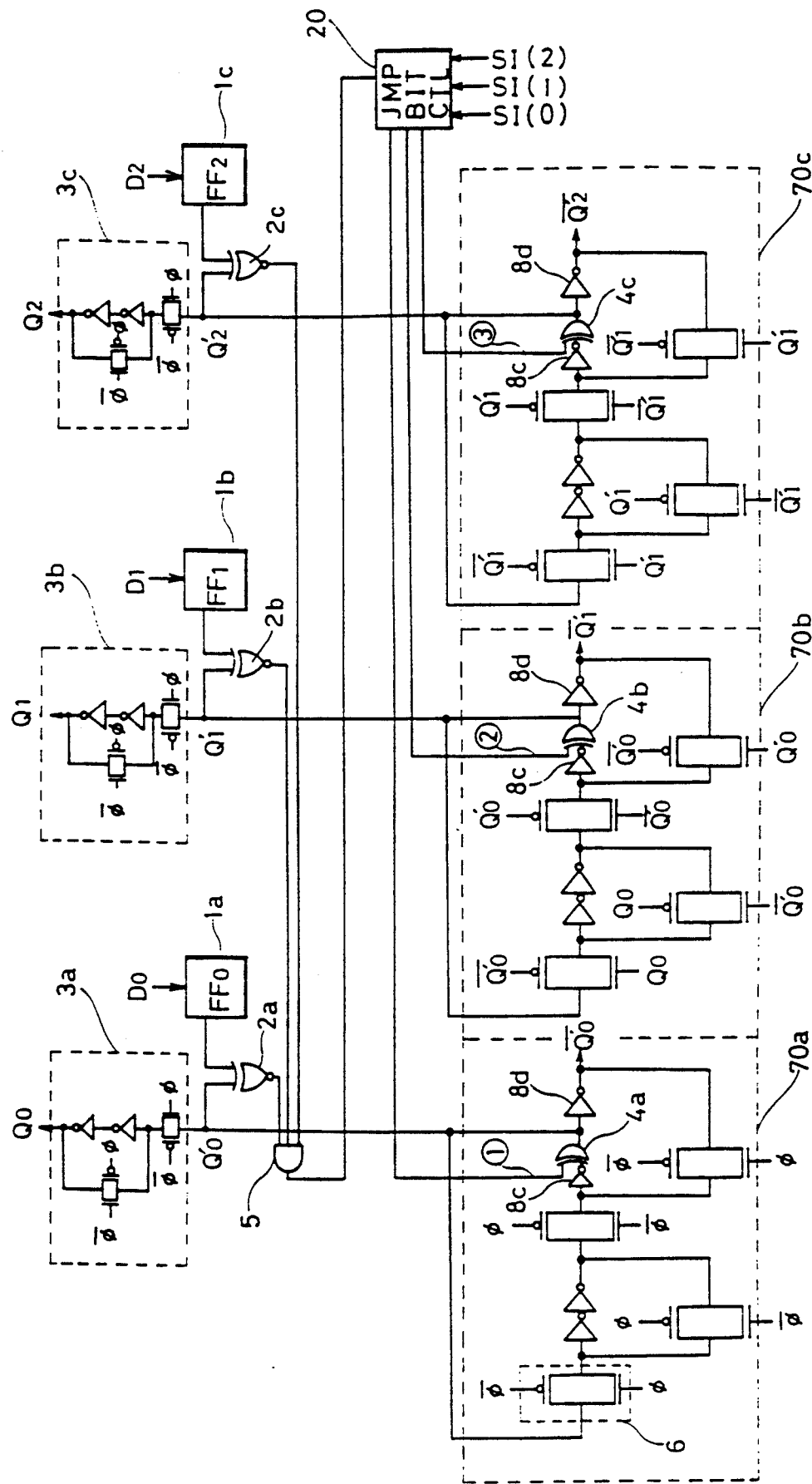
FIG. 15 is a diagram showing a counter device according to a further embodiment of this invention.

FIG. 15 is a diagram specifically showing a counter device according to a further embodiment shown in FIG. 14. Like reference numerals are used to identify like elements of this counter device and the counter device shown in FIG. 1. In FIG. 15, the counter device includes ExOR gates 4a, 4b and 4c each disposed between the inverters 8c and 8d in the second-stage latch block of each of the counters 70a–70c, respectively.

This counter device further includes a jump bit number control circuit 20 for causing selected counts of bit counters to be jumped in response to jump bit number specifying signals SI(0), SI(1) and SI(2) specifying the number of bits to be jumped. This jump bit number control circuit 20 is triggered by an equality detection signal from the AND gate 5 to transmit an "H" signal to a selected combination of ExOR gates 4a–4c in response to the jump bit number specifying signals SI(0)–SI(2).

In correspondence between FIG. 14 and FIG. 15, the counter unit 450 includes the binary counters 70a, 70b and 70c, the jump code storage unit 452 includes the flip-flops 1a, 1b and 1c, the comparator 454 includes the ExNOR gates 2a, 2b and 2c, and AND gate 5, and the jump bit control unit 458 corresponds to the jump bit control circuit 20. The count adjust unit 460 includes the ExOR gates 4a, 4b and 4c. In FIG. 15, the jump bit number storage unit 456 is not provided, and the jump bit number specifying signals SI(0) to SI(2) are externally applied. First, a jumping operation of the counter device shown in FIG. 15 will be described briefly with reference to FIGS. 16A–16D. FIGS. 16A–16D are diagrams for explaining an operation in applying "H" to only one of the ExOR gates 4a–4c. Further, in FIGS. 16A–16D, an example is given in which four counters are connected in series.

First, when "H" is applied only to node ①(FIG. 16A), only the ExOR gate 4a acts as an inverter to carry out a counting operation with jumping of only a jump code as described hereinbefore. In other words, one bit is jumped when "H" is applied to only node ①.

When "H" is applied only to node ② as shown in FIG. 16B, the ExOR gate 4b acts as an inverter to invert the second bit. If a carry occurs as a result of this inversion, the third bit will be inverted also. That is, where the counter has a 4-bit construction and when its count reaches "1101", for example, the count becomes "1111" with the second bit "0" inverted to "1". In this case, a counting operation with jumping of two bits is effected, that is "1101" and 1110" are jumped.

If the second bit is "1", a change is made from "1" to "0". In this case, the value of the third bit is correspondingly incremented by "1". That is, in FIG. 15, the first-stage and second-stage latch blocks of the counter 70c are connected in response to this output bit Q'1, and the inverter 8c inverts output bit Q'2. Thus, the counting operation with jumping of two bits is achieved in either case.

When "H" is applied only to node ③ as shown in FIG. 16C, the ExOR gate 4c for the third bit acts as an inverter to invert the output of the inverter 8c. This means an addition of "1" to the third bit, resulting in a counting operation with jumping of four bits. That is, if the count becomes "01101" which equals the jump code, for example, the third bit "1" is inverted to "0". As a result of the change of the third bit from "1" to "0", a carry is transferred to the fourth bit whereby the fourth bit also changes from "1" to "0". Further, a carry occurs from the fourth bit to change the fifth bit from "0" to "1". This means that the count has jumped from "011013" to "10000", which realizes a jump of four counts in decimal numbers.

Further, when "H" is applied only to node ④ for a fourth ExNOR gate (not shown in FIG. 15), the bit in the fourth digit is inverted and a carry occurring then is transferred to a next stage, thereby effecting a counting operation with jumping of 2 cubed counts. If, as shown in FIG. 16D, the jump code is set to "101101", the count output next is "110101", which realizes a counting operation with jumping of 8 counts in decimal numbers. When only one ExOR gate is caused to act as an inverter as described above, a counting operation is realized which jumps counts 2 of to zero power, 2 to the first power, 2 squared and 2 cubed.

In addition, a desired number of bits may be jumped by causing a selected combination of ExOR gates 4a–4c to function as inverters. The number of bits to be jumped then is determined by the jump bit number specifying signals SI(0), SI(1) and SI(2). A specific example of the jump bit number control circuit 20 is shown in FIG. 17.

Figures 17, 18:
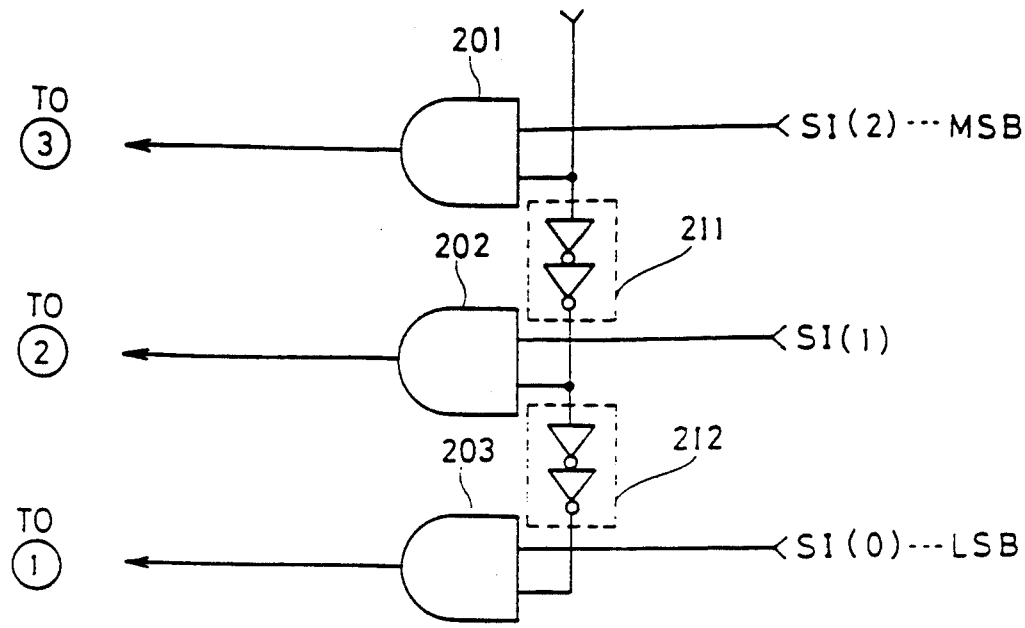
FIG. 17 is a diagram showing one example of jump bit number control circuit.
FIG. 18 shows relations between the jump bit number signals shown in FIG. 17 and numbers of jumped bits.

Referring to FIG. 17, the jump bit number control circuit 20 includes AND gates 201, 202 and 203, and delay circuits 211 and 212. Each of the delay circuits 211 and 212 includes two inverters connected in series.

The AND gate 201 receives the most significant bit SI(2) of the jump bit number specifying signals at one of its inputs, and the equality detection signal from the AND gate 5 at the other input. Output of the AND gate 201 is applied through node ③ to one of the inputs of the ExOR gate 4c.

The AND gate 202 receives the second bit SI(1) of the jump bit number specifying signals at one of its inputs, and the equality detection signal from the AND gate 5, as delayed by the delay circuit 211, at the other input. Output of the AND gate 202 is applied through node ② to one of the inputs of the ExOR gate 4b.

The AND gate 203 receives the least significant bit SI(0) of the jump bit number specifying signals at one of its inputs, and the equality detection signal from the AND gate 5, as delayed by the delay circuit 212, at the other input. Output of the AND gate 203 is applied through node ① to one of the inputs of the ExOR gate 4a.

FIG. 18 is a table listing relations between the jump bit number specifying signals SI(0)–SI(2) and numbers of jumped bits. The numbers of jumped bits are shown in decimal numbers in FIG. 18. That is, the jump bit number specifying signals SI(0)–SI(2) are obtained by expressing a desired number of jumped bits in binary form. The operations carried out when the number of jumped bits is 1, 2 and 4 have already been described with reference to FIGS. 16A–16D. Operations for the other numbers of jumped bits will be described hereunder.

Assume that the number of jumped bits is selected to 3 and that the signal SI(2) is "0" and the signals SI(1) and SI(0) are both "1". When an equality is attained between the jump code set in the flip-flops 1a–1c and the count of the counters 70a–70c, the AND gates 201 and 202 are enabled to cause nodes and ② and ① to rise to "H" in the stated order. In this case, the ExOR gate 4b in the second counter 70b first acts as an inverter, thereby realizing the operation for jumping two bits in the count of the counters 70a–70c. Next, the ExOR gate 4a of the counter 70a acts as an inverter to realize the operation for jumping one bit. As a result, a total of three bits are jumped. The jumping operation of the first counter follows that of the higher order bit counter in order that the jumping operation of the lower order bit counter be carried out after the count of the higher order bit counter is incremented and its output is established, thereby positively realizing a count jump of a desired number of bits. The successive jumping operations of these counters are effected by means of the delay circuits 211 and 212.

An operation when the jump bit number specifying signals SI(0)–SI(2) represent "101" will be described next. In this case, when the count of the counters 70a–70c equals the jump code, the output of the AND gate 201 first rises to "H" which, through node ③, causes the ExOR gate 4c to act as an inverter. This results in the counting up of four bits in third counter 70c. After completion of counting of the four bits, the output of the AND gate 203 rises to "H" which, through node ①, causes the ExOR gate 4a to act as an inverter. This realizes the operation for jumping one bit. As a result, a total of five bits are jumped.

An operation when the jump bit number specifying signals SI(0)–SI(2) are all "1" will be described next. In this case, when an equality is detected between a predetermined jump code and the count of the counters 70a–70c, the output of the AND gate 201 first rises to "H" in response to the equality detection signal from the AND gate 5. This realizes the 4-bit jumping operation of the third counter 70c. After completion of the jumping operation of the third counter 70c, the output of the AND gate 202 rises to "H" which realizes an operation of the second counter 70b for jumping two bits. After completion of the jumping operation of the second counter 70b, the output of the AND gate 203 rises to "H" which realizes the operation of the counter 70a for jumping one bit. As a result, a total of seven bits are jumped.

The construction shown in FIG. 15 implements a desired number of jumped bits but, when a jumping operation for an upper bit is followed by a jumping operation of a lower bit counter, the output of the ExOR gate for the upper bit might show unequality. In order to avoid such a situation in which the output of the AND gate 5 shows an unequality during a jumping operation, and to realize a desired jumping operation reliably, a latch circuit may be interposed between the output of the AND gate 5 and the jump bit number control circuit 20 for latching the output of the AND gate 5 for a period of time exceeding the delay time provided by the delay circuits 211 and 212. Such a latch circuit may, for example, comprise a D-type flip-flop which latches and outputs the output of the AND gate 5 in response to a fall of the clock signal φ, the output thereof being reset after lapse of the delay time provided by the delay circuits 211 and 212. Where the D-type flip-flop is included, a latch circuit having a desired function may be obtained by arranging such that this D flip-flop receives the output of the AND gate 5 at its D-input, and the clock signal φ as inverted at the clock input, with the Q-output thereof connected to the respective AND gates 201-203 of the jump bit control circuit 20, the output Q being connected to its reset input through a delay circuit having a predetermined delay time.

The described embodiments include the counter output retaining latches 3a, 3b and 3c in order to avoid the count output becoming unstable during the jumping operation of the counter device. However, these counter output retaining latches 3a-3c are not essential where the instability of the output of the counters occurs only for a brief period and exerts only negligible adverse influences in a practical use of the counter device.

Further, in the described embodiments, flip-flops are used as the device for storing the jump code. However, the same advantages may be obtained as in the described embodiments by directly applying a desired jump code from an outside of the device to the counter device instead of using the flip-flops.

Similarly, the jump bit number specifying signals SI(0)-SI(2) applied to the jump bit number control circuit 20 may be stored in storage devices such as flip-flops or ROM as shown in FIG. 14, or may be applied directly from an outside.

The delay circuits 211 and 212 may be replaced with a data latch operable in response to a frequency-divided clock signal for latching and outputting a received signal.

The described embodiments use the ExNOR gates and AND gate for comparing the counter output bits and jump code, and the ExOR gate for achieving count jumping. The same advantages may be assured as in the foregoing embodiments by using any other types of logic gates as long as desired logic is implemented.

Although asynchronous binary counters are discussed in the foregoing, the same advantages may be assured as in the foregoing embodiments by using ternary, octal or other such counters in place of the count-up or count-down binary counters as long as such counters are the ripple carry type.

Furthermore, the counter output retaining latches 3a-3c are not limited to the circuit constructions shown in FIGS. 11 and 15. The same advantages may be assured as in the foregoing embodiments as long as these latches are operable in response to the clock signal φ to latch and output the output bits applied thereto.

With the counter device of the present invention, a memory device can be implemented in which a defective bit can be repaired without increasing an access time and with data sequence maintained.

Figure 19:
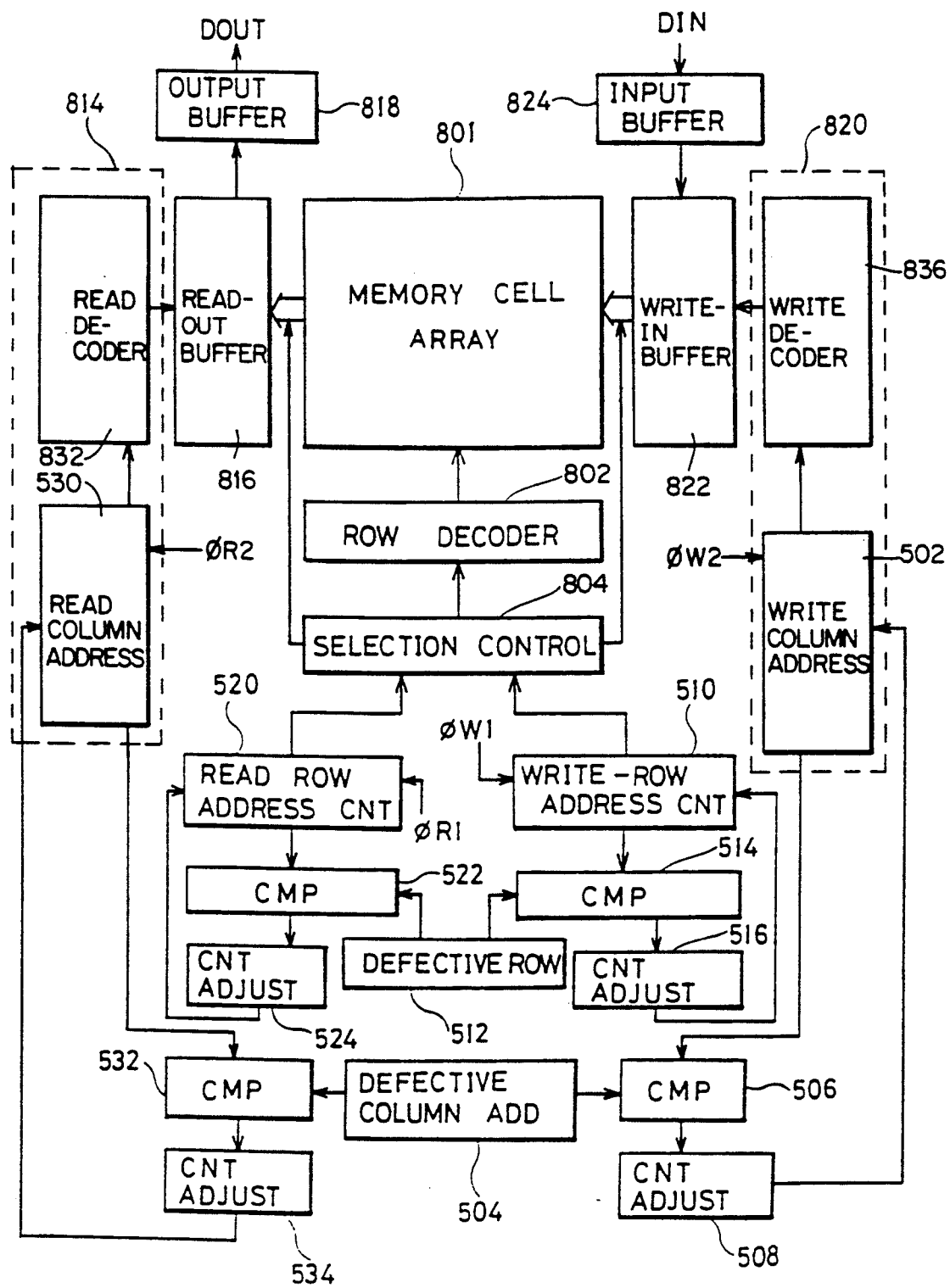
FIG. 19 shows schematically an overall structure of a memory device according to a further another embodiment of the invention.

FIG. 19 shows schematically an overall structure of a memory device according to still further embodiment of the present invention. The memory device shown in FIG. 19 includes the counter device as shown in FIG. 10 or 14 as an address counter, and provides an improvement to the memory device as shown in FIG. 6.

Figure 6:
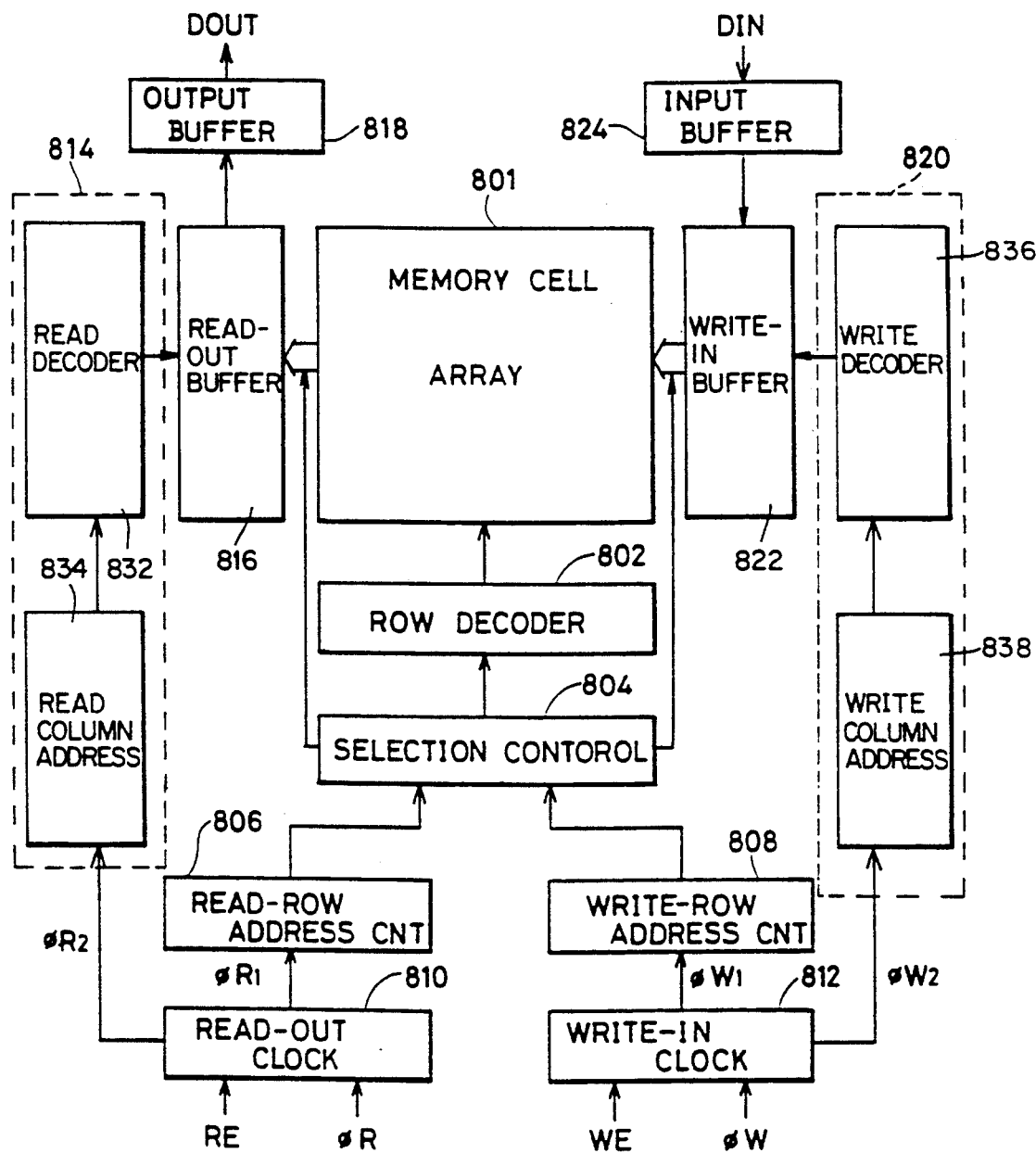
FIG. 6 is a block diagram showing an overall structure of a conventional FIFO type memory device.
Figure 7:
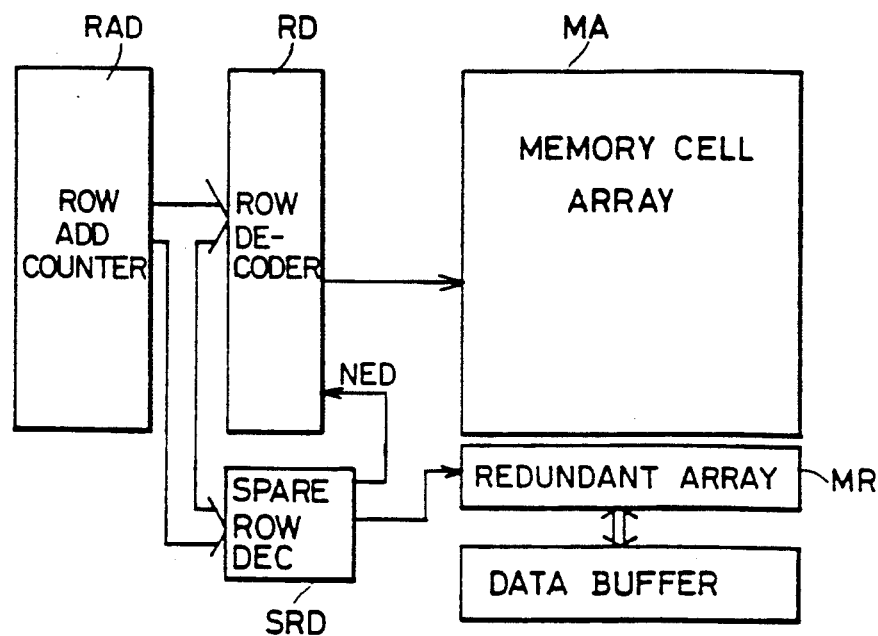
FIG. 7 is a functional block diagram showing a conventional redundancy scheme used in the memory device as shown in FIG. 6.
Figure 8:
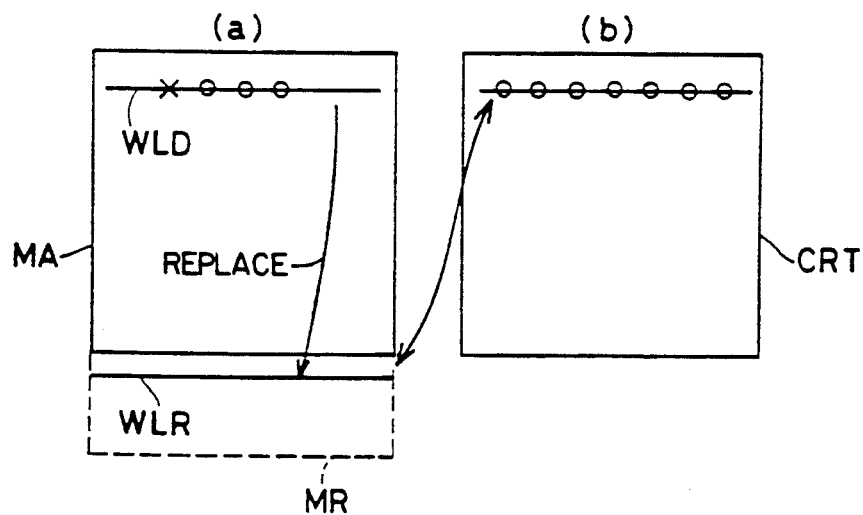
FIG. 8 illustrates a correspondence between word lines in a memory cell array and horizontal lines on a display screen when the redundancy scheme shown in FIG. 7 is employed.
Figure 9:
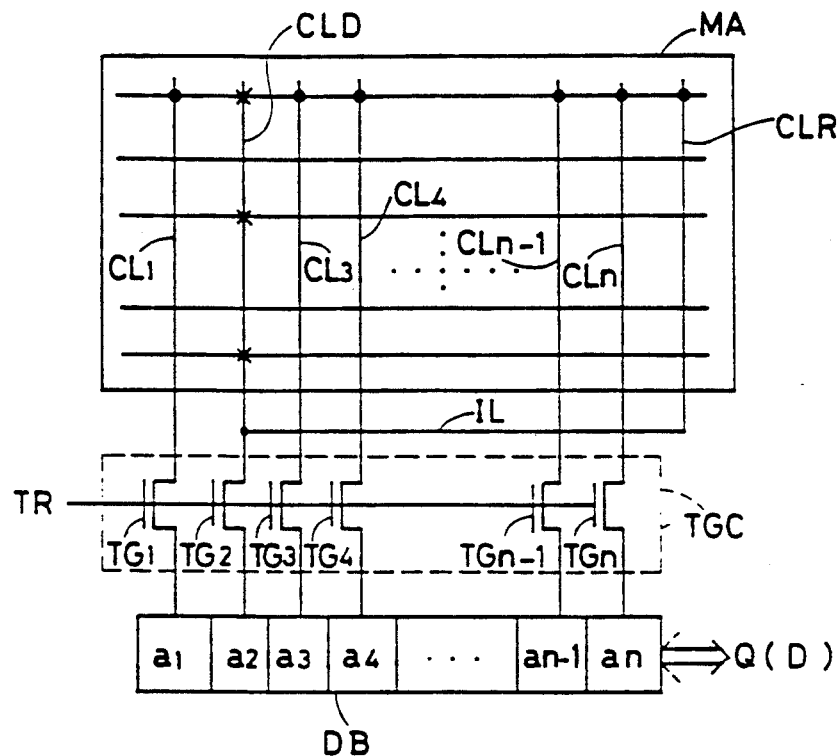
FIG. 9 illustrates a possible redundancy scheme for repairing redundancy scheme for repairing a defective column in the memory device as shown in FIG. 6.

In FIG. 19, components corresponding to those shown in FIG. 6 have like reference numerals added thereto.

Referring FIG. 19, a write column address counter 502 comprises an asynchronous or ripple counter for counting the second write clock signal φW2 to generate a write column address. In order to repair a defective column in the memory array, there are provided a defective column address storage circuit 504 for storing a defective column address indicating a defective column in the array 801, a comparator 506 for comparing a count of the write column address counter 502 and the defective column address in the storage circuit 504, and a count adjusting circuit 508 responsive to an output of the comparator 506 for adjusting or modifying the count of the write column address counter 502.

For write row selection circuitry, there are provided a write row address counter 510 comprising an asynchronous or ripple counter and for counting the first write clock signal φW1 to generate a write row address, a defective row address storage circuit 512 for storing a defective row address indicating a defective row in the array 801, a comparator 514 for comparing a count of the write-row address counter 510 and the defective row address stored in the defective row address storage circuit 512, a count adjust circuit 516 responsive to an output of the comparator 514 for adjusting or modifying the count of the write-row address counter 502.

Read row selecting circuitry includes a read-row address counter 520 comprising an asynchronous or ripple counter and for counting the first read clock signal φR1 to generate a read row address, a comparator 512 for comparing a count of the read row address counter 520 and the defective row address in the storage circuit 512, and a count adjust circuit 524 responsive to an output of the comparator 522 for adjusting or modifying the count of the read-row address counter 524.

The read column selecting circuitry includes a read column address counter 530 for counting the second read clock signal φR2 to generate a read column address, a comparator for comparing a count of the read column address counter 530 and the defective column address in the storage circuit 504, and a count adjust circuit 534 responsive to an output of the comparator 532 for adjusting or modifying the count of the read column address counter 530.

The write column address counter 502, the defective column address storage circuit 504, the comparator 506 and the count adjust circuit 508 constitute one counter device of FIG. 10, while the write row address counter 510, the defective row address storage circuit 512, the comparator 514 and the count adjust circuit 516 constitute one counter device as shown in FIG. 10.

The read row address counter 520, the defective row address storage circuit 512, the comparator 522 and the count adjust circuit 524 constitute one counter device of FIG. 10, while the read column address counter 530, the defective column address storage circuit 504, the comparator 532 and the count adjust circuit 534 constitute one counter device of FIG. 10.

The defective row address storage circuit 512 and the defective column address storage circuit 504 each may include laser programmable fuse elements to program a defective row or column address therein, in place of flip-flops.

In the configuration shown in FIG. 19, the memory cell array 801 includes at least (n+1) row and (m+1) columns when the row decoder 802 has (n+1) outputs, and the read and write decoders 832, 836 has an m outputs. The read-out buffer 816 and the write-in buffer 822 has the data storage elements corresponding in number and position to the columns of the memory cell array 801.

Figure 20:
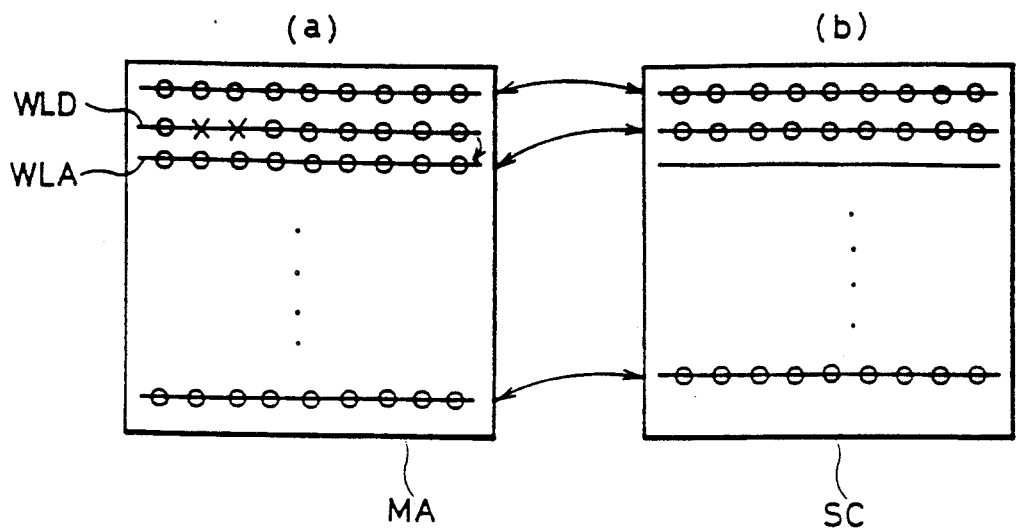
FIG. 20 is an illustration showing a correspondence between word lines and horizontal lines in the present invention.

In operation, when a count of the read-row or write-row address counter 520 or 510 coincides with the defective row address which has been already programmed by blowing-off of fuse elements, for example, in the defect row address storage circuit 512, the count if skipped to the very next count, so that the defective row in the memory cell array 801 is not selected. More specifically, as shown in FIG. 20, a defective row (word line) WLD is replaced with the adjacent word line WLA to repair the defective row. Each row having a row address greater than the defective row address has a new address greater by 1 than an address which would be allotted thereto if no defective row is found.

In the repairing scheme, the arrangement of bits in the memory array MA is partially shifted by one row with respect to the arrangement of video data in the display screen SC as shown in FIG. 20. However, no spare row decoder is used, so that the defect row (word line) WLD is never selected, resulting in fast repairing of the defective row to provide a fast access time.

Figure 21:
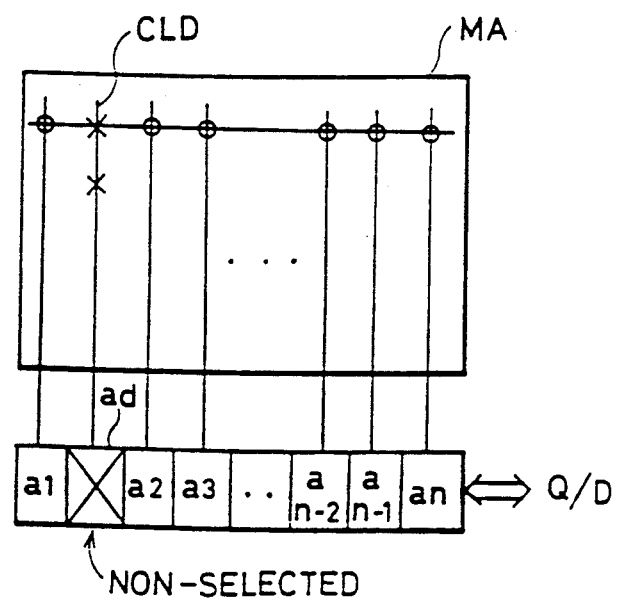
FIG. 21 is an illustration showing a redundancy scheme for columns in the invention.

In repairing a defective column, a defective column address is skipped by means of the count adjust circuit 508 or 534 when a count of the column address counter 520 or 530 coincides with the defective column address, so that the defective column in the array 801 is never selected. More specifically, referring to FIG. 21, when an address from the column address counter 502 or 530 designates a defective column CLD, the address indicating the defective column CLD is skipped or jumped over to the very next column address, so that a data storage element al is never connected to the data input buffer 824 or the data output buffer 818. Thus, the data sequence of al through an of applied video data is maintained in reading data out with ease without degrading an access time or fast operability.

In the above described embodiment, a FIFO type memory device is discussed as an example. However, the invention can apply to any other memory device as far as a memory device include a counter counting a clock signal for generating a row or column address.

In addition, the number of rows or columns to be repaired may be two or more.

Further, the defective row or column address storage unit is replaced with an externally programmable storage unit, and the counter device as shown in FIG. 14 is employed as an address generator, masked data reading and writing can be easily implemented.

According to this invention, as described above, the count provided by the counters is modified by a desired value when the count reaches a predetermined value. This feature provides a counter device capable of a counting operation with jumping of a selected range of counts.

Particularly where the counting device of this invention is applied to a system in which elements under control are sequentially driven on the basis of the count of the counters, a control device may be realized which has a control sequence readily variable without involving changes made to the control device. Thus, the invention enables building up of a flexible sequence control system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A counter device comprising;
    counting means for counting clock pulses,
    first setting means for setting a predetermined first count value,
    second setting means for setting a predetermine second count value,
    detecting means for detecting equality/unequality in value between a count of said counting means and said first count set by said first setting means, and
    means for modifying the count of said counting means by said second count value in response to an equality detection signal from said detecting means.

2. A counter device according to claim 1, further comprising output latching means for latching the count output from said counting means, said output latching means being operable in a way complementary with said counting means to provide output as a count of said counter device.

3. A counter device according to claim 1, wherein said counting means is operable to output a count in a plurality of bits, and said modifying means including means for varying the count successively from an upper bit of the counting means.

4. A counter device comprising;
    counting means including a plurality of one-bit counters connected in series, each of said one-bit counters being connected to receive an output bit of a counter of a lower order as an input to be counted, a counter of a lowermost order receiving at a count input thereof clock pulses to be counted, and output bits of said plurality of one-bit counters being output in parallel to represent a count of said clock pulses,
    first setting means for setting a jump starting count of said counting means,
    second setting means for setting a number of a count to be jumped of said counting means,
    detecting means for detecting equality/unequality between the output count of said counting means and said jump starting count set by said first setting means,
    a plurality of gate means each associated with each said one-bit counter, each said gate means being operable to transfer an output of the corresponding one-bit counter to a count input of a next adjacent higher order one-bit counter, and
    gate operation setting means operable in response to the number of the count to be jumped set by said second setting means and an equality detection signal from said detecting means, to set an operating mode of each of said plurality of gate means selectively to one of noninversion transfer and inversion transfer.

5. A counter device according to claim 4, wherein said gate operation setting means includes means responsive to said equality detection signal for setting the operating mode of the gate operation setting means sequentially from an upper bit order one-bit counter to a lower bit order one-bit counter.

6. A counter device according to claim 4, wherein;
    the number of the count to be jumped set by said second setting means includes a plurality of bits each specifying the operating mode of each of said gate means, each of said gate means includes a two-input logic gate for receiving the output bit of the corresponding one-bit counter at one input thereof, and said gate operation setting means being operable to apply each of a plurality of bits of said second setting means to the other input of the corresponding two-input logic gate, whereby said two-input logic gate acts as a buffer or an inverter for the output bit of the corresponding one-bit counter.

7. A method of counting clock pulses comprising the steps of;

setting a predetermined first count and a predetermined second count, counting said clock pulses, comparing a count of said clock pulses and said first count and detecting equality/unequality therebetween, and modifying the count of said clock pulses by said second count in response to an equality detected at the equality/unequality detecting step.

8. A method according to claim 7, further comprising the step of latching and outputting the count of said clock pulses in a way complementary with counting operation of said clock pulses.

9. A method according to claim 7, wherein said count modifying step includes the step of changing the count by said second count in a direction in which the count varies.

10. A method of counting clock pulses by using an asynchronous counter device including a plurality of one-bit counters connected in series, each of said one-bit counters being connected to receive an output of a counter of a lower order as a count input, and a counter of a lowermost order receiving said clock pulses as a count input, said method comprising the steps of;

setting a predetermined first count, setting control signal bits each specifying inversion/non-inversion of an output bit of each said one-bit counter, counting said clock pulses, comparing a count of said clock pulses and said first count and detecting equality/unequality therebetween, and selectively inverting the output bits of said one-bit counters in response to an equality detected at the equality/unequality detecting step and to said control signal bits.

11. A method according to claim 10, wherein said selectively inverting step includes the steps of:

effecting the inversion/non-inversion of the output bits sequentially from a one-bit counter of a higher bit order to a lower bit order one-bit counter, and inverting the output bit of a next higher order one-bit counter again when the inversion of the output bit of a one-bit counter of a lower order influences the output bit of the next higher order one-bit counter.

12. A binary ripple counter comprising:

a counter circuit for counting input pulses, said circuit including a plurality of single bit stages arranged in series, output terminals of each order single bit stage being connected to clock input terminals of the next higher ordered single bit stage, the lowest order single bit stage receiving the input pulses to be counted;

storage elements retaining predetermined first and second count values; and count modifying elements interconnected with said single bit storage stages for modifying an output value of said counter circuit in amount corresponding to said second count value when said predetermined first count value and a count produced by said counter circuit have attained a predetermined relationship.

13. The counter of claim 12, wherein said count modifying elements include delay means for successively modifying output values of said single bit stages.

14. The counter of claim 12, including a logic circuit responsive to said predetermined first count value for controlling said count modifying elements.

15. The counter of claim 12, wherein said count modifying elements comprise a comparison circuit for comparing said output value of said single bit stages and said predetermined first count value.

16. The counter of claim 13, wherein said delay means includes a plurality of gate elements corresponding to said single bit stages, each said gate element having first and second input terminals and having an output terminal for modifying an output value of a corresponding one of said signal bit stages, said first input terminals of said gate elements receiving said predetermined second count, a first one of said second input terminals of said gate elements corresponding to a highest order bit stage of said counter circuit, said second input terminals of said gate elements receiving an output signal from a logic circuit, and delay elements connected between successive ones of said second terminals for delaying said output signal of said logic circuit.

17. A ripple counter for providing a count signal of plural bits and including a plurality of counter segments corresponding to said plural bits, said counter comprising:

register means for storing a reference signal comprising the same plurality of bits as said plural bits of said count signal; and modifying means for comparing the count signal of said ripple counter with the reference signal of said register means and inverting a bit of the least significant bit counter segment upon coincidence of said count signal and said reference signal.

18. A counter providing an output signal comprised of a plurality of bits, comprising:

counter means for providing said output signal, said counter means comprising a plurality of counter segments corresponding in number to said plurality of bits, each said counter segment storing and outputting a binary value of a "1" or a "0";

a counter segment corresponding to the least significant bit of said output signal receiving a clock signal and inverting the stored bit therein in response to receipt of said clock signal and providing the inverted bit as its output;

the counter segments corresponding to bits other than the least significant bits of the count signal receiving an output from the counter segment in the former stage and responsive to either rise or fall, but not both, of the output of the counter segment in the former stage to invert the stored content and provide the inverted content as the output;

first register means for storing a reference signal comprising the same plurality of bits as said plurality of bits of said count signal;

second register means for storing a signal indicating a count up number for said count signal to be counted up;

detector means for comparing the count signal of said counter means with the reference signal of the first register means to provide a coincidence signal upon coincidence of the count signal and the reference signal; and modifying means responsive to the coincidence signal of the detector means and to the signal indicating said count up number for inverting or non-inverting, selectively, the stored contents in said plurality of counter segments.

* * * * *